(12) United States Patent
Khamesra et al.

(10) Patent No.: US 11,671,013 B2
(45) Date of Patent: Jun. 6, 2023

(54) CONTROL LOGIC PERFORMANCE OPTIMIZATIONS FOR UNIVERSAL SERIAL BUS POWER DELIVERY CONTROLLER

(71) Applicant: Cypress Semiconductor Corporation, San Jose, CA (US)

(72) Inventors: Arun Khamesra, Bangalore (IN); Hariom Rai, Bangalore (IN); Rajesh Karri, Visakhapatnam (IN); Pulkit Shah, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 121 days.

(21) Appl. No.: 17/463,339

(22) Filed: Aug. 31, 2021

(65) Prior Publication Data
US 2022/0069713 A1    Mar. 3, 2022

Related U.S. Application Data

(60) Provisional application No. 63/074,635, filed on Sep. 4, 2020, provisional application No. 63/073,866, filed on Sep. 2, 2020.

(51) Int. Cl.
*H02M 3/158* (2006.01)
*H03F 3/45* (2006.01)

(52) U.S. Cl.
CPC ...... *H02M 3/1582* (2013.01); *H03F 3/45475* (2013.01)

(58) Field of Classification Search
CPC .................. H02M 3/1582; H03F 3/45475
(Continued)

(56) References Cited

U.S. PATENT DOCUMENTS

| | | | |
|---|---|---|---|
| 8,841,895 B2 * | 9/2014 | Prexl | H02M 3/158 323/285 |
| 10,992,231 B1 * | 4/2021 | Yang | H02M 3/157 |

(Continued)

OTHER PUBLICATIONS

Written Opinion of the International Searching Authority for International Application No. PCT/US2021/048732 dated Jan. 28, 2022; 7 pages.
(Continued)

*Primary Examiner* — William Hernandez

(57) ABSTRACT

An IC controller for USB Type-C device includes an error amplifier (EA), which includes an EA output coupled to a PWM comparator of a buck-boost converter; a first transconductance amplifier to adjust a current at the EA output, the first transconductance amplifier operating in a constant voltage mode; and a second transconductance amplifier to adjust the current at the EA output, the second transconductance amplifier operating in a constant current mode. A first set of programmable registers is to store a first set of increasingly higher transconductance values. A second set of programmable registers is to store a second set of increasingly higher transconductance values. Control logic is to: cause the first transconductance amplifier to operate while sequentially using transconductance values stored in the first set of programmable registers; and cause the second transconductance amplifier to operate while sequentially using transconductance values stored in the second set of programmable registers.

20 Claims, 13 Drawing Sheets

(58) Field of Classification Search
USPC .......................... 327/518, 520, 530, 538, 564
See application file for complete search history.

(56) References Cited

U.S. PATENT DOCUMENTS

| | | |
|---|---|---|
| 2010/0277148 A1 | 11/2010 | Zhao et al. |
| 2014/0203763 A1 | 7/2014 | Zhao et al. |
| 2016/0118880 A1 | 4/2016 | Motoki |
| 2016/0365802 A1 | 12/2016 | Freeman et al. |
| 2019/0173383 A1* | 6/2019 | Gao ..................... H02M 3/155 |
| 2019/0278731 A1 | 9/2019 | Arulappan et al. |
| 2019/0305666 A1* | 10/2019 | Yang ................... H02M 1/0009 |
| 2022/0066980 A1* | 3/2022 | Khamesra ................. G06F 1/08 |
| 2022/0069709 A1* | 3/2022 | Rai ..................... H02M 1/0025 |
| 2022/0069710 A1* | 3/2022 | Vispute .................. H02M 1/08 |
| 2022/0069711 A1* | 3/2022 | Karri ................... H02M 1/0016 |
| 2022/0069712 A1* | 3/2022 | Mondal ............... H02M 1/0009 |
| 2022/0069715 A1* | 3/2022 | Karri ................... H02M 1/0003 |

OTHER PUBLICATIONS

International Search Report for International Application No. PCT/US2021/048732 dated Jan. 28, 2022; 4 pages.

\* cited by examiner

CONTROL LOGIC PERFORMANCE OPTIMIZATIONS FOR UNIVERSAL SERIAL BUS POWER DELIVERY CONTROLLER

RELATED APPLICATIONS

This application claims the benefit of U.S. Provisional Patent Application No. 63/073,866, filed on Sep. 2, 2020, and U.S. Provisional Patent Application No. 63/074,635, filed on Sep. 4, 2020, the entire contents of which are incorporated herein by this reference.

TECHNICAL FIELD

This disclosure relates to integrated circuits (ICs) that control Universal Serial Bus (USB) power delivery to electronic devices.

BACKGROUND

Various electronic devices (e.g., such as smartphones, tablets, notebook computers, laptop computers, chargers, adapters, power banks, etc.) are configured to transfer power through USB connectors according to USB power delivery protocols defined in various versions and revisions of the USB Power Delivery (USB-PD) specification. For example, in some applications an electronic device may be configured as a power consumer to receive power through a USB connector (e.g., for battery charging), while in other applications an electronic device may be configured as a power provider to provide power to another device that is connected thereto through a USB connector. In various applications, electronic manufacturers may also use power converters (e.g., such as buck-boost converters) that need to meet various USB-PD specification requirements such as, for example, requirements for output voltage (Vout) monotonicity and stability.

DETAILED DESCRIPTION

Figure 1:
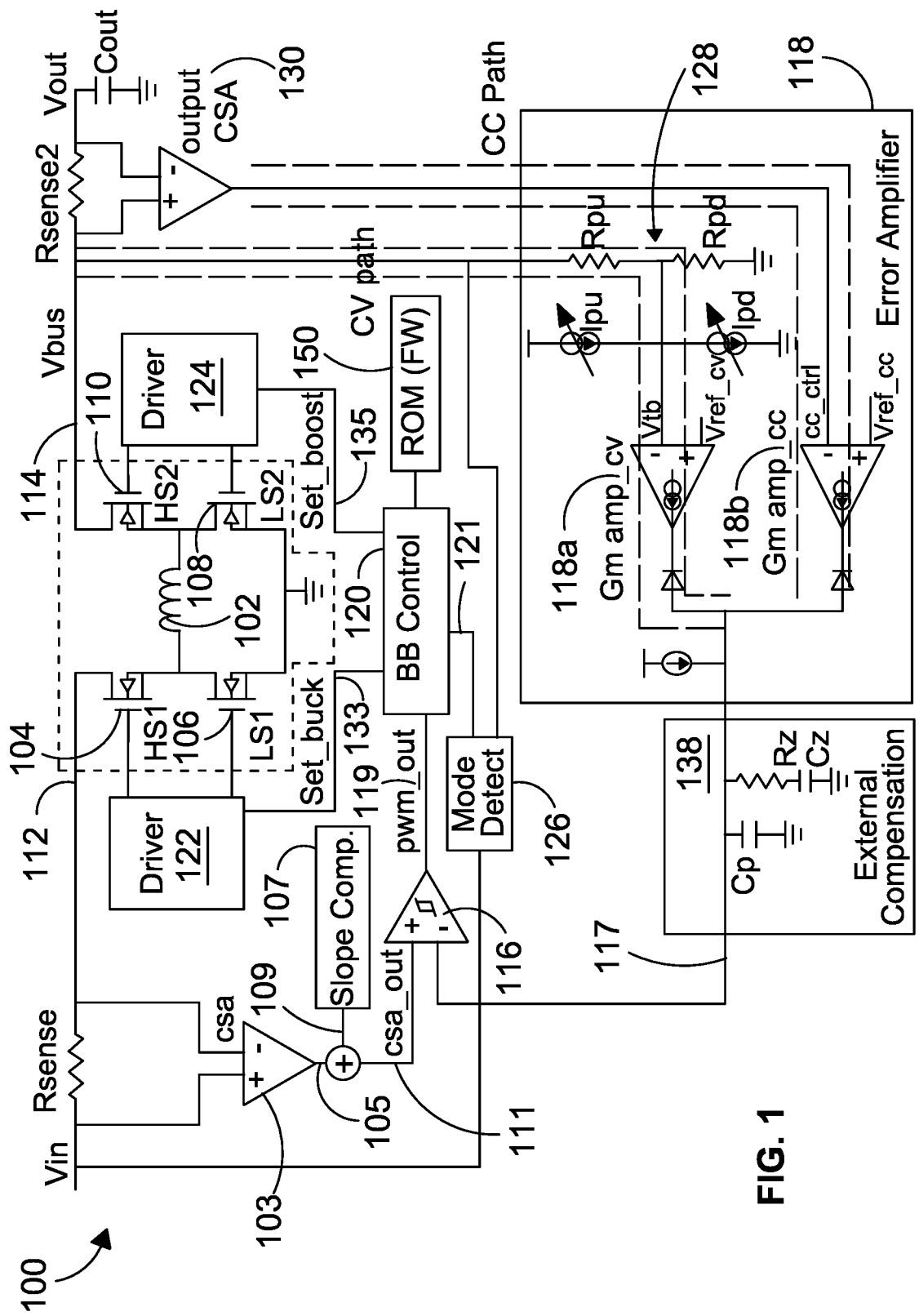
FIG. 1 is a schematic diagram of a USB controller that includes a buck-boost converter in at least one embodiment.

The following description sets forth numerous specific details such as examples of specific systems, components, methods, and so forth, in order to provide a good understanding of various embodiments of control logic optimizations for USB Type-C controllers as described herein. It will be apparent to one skilled in the art, however, that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of buck-boost converters for USB Type-C controllers that include a constant voltage (CV) transconductance (Gm) amplifier and a constant current (CC) transconductance amplifier that can be disposed to operate in various electronic devices. Examples of such electronic devices include, without limitation, personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., cables, hubs, docking stations, adapters, chargers, etc.), audio/video/data recording and/or playback devices (e.g., cameras, voice recorders, hand-held scanners, monitors, etc.), and other similar electronic devices that can use USB interfaces for communication, battery charging, and/or power delivery.

As used herein, "USB-enabled" device or system refers to a device or system that includes, is configured with, or is otherwise associated with a USB connector interface. A USB-enabled electronic device may comply with at least one release of a Universal Serial Bus (USB) specification. Examples of such USB specifications include, without limitation, the USB Specification Revision 2.0, the USB 3.0 Specification, the USB 3.1 Specification, the USB 3.2 Specification and/or various supplements, versions and errata thereof. The USB specifications generally define the characteristics (e.g., attributes, protocol definition, types of transactions, bus management, programming interfaces, etc.) of a differential serial bus that are required to design and build standard communication systems and peripherals. For example, a USB-enabled peripheral device attaches to a USB-enabled host device through a USB port of the host device to form a USB-enabled system. A USB 2.0 port includes a power voltage line of 5V (denoted VBUS), a differential pair of data lines (denoted D+ or DP, and D− or DN), and a ground line for power return (denoted GND). A USB 3.0 port also provides the VBUS, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX−), a differential pair of receiver data lines (denoted SSRX+ and SSRX−), a power line for power (denoted DPWR), and a ground line for power return (denoted DGND). A USB 3.1 port provides the same lines as a USB 3.0 port for backward compatibility with USB 2.0 and USB 3.0 communications, but extends the performance of the SuperSpeed bus by a collection of features referred to as Enhanced SuperSpeed.

A more recent technology for USB connectors, called USB Type-C (also referred to herein as "USB-C"), is defined in various releases and/or versions of the USB Type-C specification. The USB Type-C specification defines Type-C receptacle, Type-C plug, and Type-C cables that can support USB communications as well as power delivery over newer USB power delivery protocols defined in various revisions/versions of the USB-PD specification. Examples of USB Type-C functions and requirements may include, without limitation, data and other communications according to USB 2.0 and USB 3.0/3.1, electro-mechanical definitions and performance requirements for Type-C cables, electro-mechanical definitions and performance requirements for Type-C receptacles, electro-mechanical definitions and performance requirements for Type-C plugs, requirements for Type-C to legacy cable assemblies and adapters, requirements for Type-C-based device detection and interface configuration, requirements for optimized power delivery for Type-C connectors, etc. According to the USB Type-C specification(s), a Type-C port provides VBUS, D+, D−, GND, SSTX+, SSTX−, SSRX+, and SSRX− lines, among others. In addition, a Type-C port also provides a Sideband Use (denoted SBU) line for signaling of sideband functionality and a Configuration Channel (or communication channel, denoted CC) line for discovery, configuration, and management of connections across a Type-C cable. A Type-C port may be associated with a Type-C plug and/or a Type-C receptacle. For ease of use, the Type-C plug and the Type-C receptacle are designed as a reversible pair that operates regardless of the plug-to-receptacle orientation. Thus, a standard USB Type-C connector, disposed as a standard Type-C plug or receptacle, provides pins for four VBUS lines, four ground return (GND) lines, two D+ lines (DP1 and DP2), two D− lines (DN1 and DN2), two SSTX+ lines (SSTXP1 and SSTXP2), two SSTX− lines (SSTXN1 and SSTXN2), two SSRX+ lines (SSRXP1 and SSRXP2), two SSRX− lines (SSRXN1 and SSRXN2), two CC lines (CC1 and CC2), and two SBU lines (SBU1 and SBU2), among others.

Some USB-enabled electronic devices may be compliant with a specific revision and/or version of the USB-PD specification. The USB-PD specification defines a standard protocol designed to enable the maximum functionality of USB-enabled devices by providing more flexible power delivery along with data communications over a single USB Type-C cable through USB Type-C ports. The USB-PD specification also describes the architecture, protocols, power supply behavior, parameters, and cabling necessary for managing power delivery over USB Type-C cables at up to 100 W of power. According to the USB-PD specification, devices with USB Type-C ports (e.g., such as USB-enabled devices) may negotiate for more current and/or higher or lower voltages over a USB Type-C cable than are allowed in older USB specifications (e.g., such as the USB 2.0 Specification, USB 3.1 Specification, the USB Battery Charging Specification Rev. 1.1/1.2, etc.). For example, the USB-PD specification defines the requirements for a power delivery contract (PD contract) that can be negotiated between a pair of USB-enabled devices. The PD contract can specify both the power level and the direction of power transfer that can be accommodated by both devices, and can be dynamically re-negotiated (e.g., without device un-plugging) upon request by either device and/or in response to various events and conditions, such as power role swap, data role swap, hard reset, failure of the power source, and the like. As used herein, "USB-PD subsystem" refers to one or more logic blocks and other analog/digital hardware circuitry, which may be controllable by firmware in an IC controller and which is configured and operable to perform the functions and to satisfy the requirements specified in at least one release of the USB-PD specification. The IC controller can be implemented in a USB Type-C device. The IC controller can be implemented in a USB device.

Power delivery in accordance with the USB-PD specification(s) can be embodied in several different types of USB Type-C applications. Examples of such types of Type-C applications include, but may not be limited to: a downstream facing port (DFP) application, in which an IC controller with a USB-PD subsystem is configured to provide a downstream-facing USB port (e.g., in a USB-enabled host device); an upstream facing port (UFP) application, in which an IC controller with a USB-PD subsystem is configured to provide an upstream-facing USB port (e.g., in a USB-enabled peripheral device or adapter); a dual role port (DRP) USB application, in which an IC controller with a USB-PD subsystem is configured to support both DFP and UFP applications on the same USB port (e.g., a USB Type-C port that is configured to operate as either a power provider or a power consumer or can alternate between these two roles dynamically by using USB-PD power role swap); and an active cable application, in which an IC controller with a USB-PD subsystem is disposed into, and configured to operate, an electronically marked cable assembly (EMCA) Type-C cable.

A USB-C/PD power supply can be used to deliver power with a wide output voltage range of 3.3V-21.5V, a wide current range of 1 A-5 A, and a wide input supply voltage range of 5.0V to 24V, as per USB-C/PD protocol. Due to this wide voltage/current range for USB-C power delivery and rapid switching requirements between input and output voltage signals, a buck-boost (BB) converter can be employed with or within a USB Type-C controller, which can be controlled to provide power to expected output loads. The buck-boost converter can be understood to be a direct current (DC) to direct current (DC) converter.

FIG. 1 is a schematic block diagram of a USB controller 100 that includes a buck-boost (BB) converter architecture according to at least one embodiment. The USB controller 100 includes a buck-boost (BB) converter 101 in at least one embodiment. Although illustrated deployed within the USB controller 100, the present BB architecture can be employed in other BB applications and contexts where a transconductance amplifier is used, such as, for example, a buck converter, a boost converter, or a BB converter.

In various embodiments, the BB converter 101 includes an inductor 102, a first high-side switch 104 (or HS1), a second high-side switch 110 (or HS2), a first low-side switch 106 (or LS1), and a second low-side switch 108 (or LS2). In one embodiment, these switches are n-type field effect transistors (NFETs), as illustrated. In another embodiment, although not illustrated, the high side switches are p-channel field effect transistors (PFETs). In various embodiments, the first high-side switch 104 is coupled between an input terminal 112 and a first side of the inductor 102 of the BB converter 101. The high-side switch 110 is coupled between a second side of the inductor 102 and an output terminal 114. The first low-side switch 106 is coupled between the first side of the inductor 102 and a ground of the BB converter 101. The second low-side switch 108 is coupled between the second side of the inductor and the ground. The input terminal 112 can carry an input voltage (Vin) and the output terminal 114 can carry an output voltage (Vout) of the BB converter 101. The BB converter 101 can further include an input capacitor (Cin) coupled to the input terminal 112 and an output capacitor (Cout) coupled to the output terminal 114.

For such a BB converter 101, the input capacitor (Cin), output capacitor (Cout), and the inductor 102 can be designed based on input, output, and load current requirements. In various embodiments, the design of the BB converter 101 (or a larger system or device that includes the BB converter 101) seeks to limit the maximum current to a certain amperage and wattage requirement. Once total output power range is known, one can determine input current requirements. From input current requirements, one can determine values for capacitance of the input and output capacitors (Cin and Cout) and for the inductance of the inductor 102.

In various embodiments, the USB controller 100 further includes a current sense amplifier (CSA) 103, a comparator 116, an error amplifier (EA) 118, BB control logic 120, a driver 122, a driver 124, and mode detect logic 126. The CSA 103 can measure an input current of the buck-boost converter 101 and can output a CSA signal 105 indicative of the input current. A slope compensation circuit 107, which can include slope compensation logic and a slope compensation capacitor, is coupled to an output of CSA 103. Slope compensation circuit 107 can add an offset signal 109 (slope compensation offset) to CSA signal 105 when enabled, generating an offset CSA signal 111. In some cases, the offset signal 109 is a current or a charge. In other cases, the offset signal 109 can be a voltage signal if other circuits are used to add the offset signal 109 to CSA signal 105.

In various embodiments, the BB converter 101 can work in either constant voltage (CV) or constant current (CC) mode depending on the load conditions. Hence, a transconductance (Gm) amplifier architecture is generally used for the EA 118 in controlling the buck-boost converter 101. A Gm amplifier works on the principle of delivering output current proportional to the input voltage difference. Splitting the EA 118 functionality between CV and CC modes of operation enables more precise closed loop control depending on the load conditions.

In at least one embodiment, the comparator 116 receives the CSA signal 111 and an EA signal 117, e.g., an output compensation signal, from the EA 118. The EA 118 can include a pair of transconductance (Gm) amplifiers, a first transconductance amplifier, e.g., a first Gm amplifier 118A that operates in a constant voltage mode, and a second transconductance amplifier 118B, e.g., a second Gm amplifier 118B that operates in a constant current mode.

In at least some embodiments, the first Gm amplifier 118A operates in the CV mode using the voltage tapped off of the voltage bus (Vbus) output of the BB converter 101. For example, the first Gm amplifier 118A can adjust an output current of the EA signal 117 based on a difference between first positive and negative inputs. The first positive input can receive a first voltage reference (Vref_cv), e.g., related to a target constant voltage, and the first negative input can be coupled to a tap point of a voltage divider 128 coupled between the Vbus and ground. The tap point provides a feedback constant voltage (Vfb) from the Vbus. This voltage (Vfb) connected to the first negative input can be tuned by sourcing current from a variable current source (Ipu) or sinking current to a variable current sink (Ipd). These Ipu sourcing current or Ipd sinking current alters the current flowing in resistor divider on the Vbus, which in-turn changes the feedback voltage (Vfb) at the input of the first transconductance amplifier 118A. The Vfb voltage can help change the Vbus voltage and thus meeting USB bus specifications of between 3V and 21V.

In at least some embodiments, the second Gm amplifier 118B operates in CC mode using current sensed from the voltage bus (Vbus). For example, the second Gm amplifier 118B can adjust the output current of the EA signal 117 based on a difference between second positive and negative inputs. The second positive input can receive a second reference voltage (Vref_cc), e.g., related to a target constant current, and the second negative input can be coupled to an output current sense amplifier (CSA) 130. The output CSA 130 is coupled to a second sense resistor positioned inline along the voltage bus (Vbus), to sense the load current of the Vbus.

In these embodiments, the USB controller 100 also includes external compensation circuitry 138 at the output of the EA 118 to help shape the EA signal 117 and enable buffering the EA signal 117 while the comparator 116 performs a comparison, which is discussed below. In some embodiments, the external compensation circuitry 138 includes at least a resistor (Rz) connected in series to a first capacitor (Cz) and a second capacitor (Cp) connected in parallel. The gain of the EA 118 can be understood to be governed by Kf*Gm*Rz, e.g., where Kf is a programmable constant, Gm is the transconductance of the EA 118, and Rz is the resistance of the resistor, Rz. Thus, two ways in which to adjust the gain, and thereby amplitude of the closed loop control response, is to adjust the programmable constant Kf or to adjust the Gm of the EA 118.

In various embodiments, the comparator 116 compares the CSA signal 111 and the EA signal 117 and provides a control signal 119, referred to as pulse width modulation (PWM) out (or pwm_out) signal, to the BB control logic 120. In one embodiment, the EA control loop as referred to herein refers to at least the constant voltage (CV) and constant current (CC) paths, the EA 118, the CSA 103, and the comparator 116 that adjusts the PWM output signal to the BB control logic 120 based on the input voltage (Vin), the output voltage (Vout or Vbus), and the reference voltages (Vref_cv and Vref_cc), the latter of which are programmable.

In various embodiments, the BB control logic 120 receives the control signal 119 and a mode signal 121 from mode detect logic 126. The mode detect logic 126 can determine a mode and a transition between modes based on the output voltage (Vout) and the input voltage (Vin), and outputs the mode signal 121 accordingly. In various embodiments, if Vin is higher than Vout, the mode detect logic 126 will output the mode signal 121 indicative of buck mode. In contrast, if Vout is higher than Vin, the mode detect logic 126 will output the mode signal 121 indicative of boost mode. In some embodiments, the mode detect logic is included within the BB control logic.

The BB control logic 120 can use the control signal 119 and the mode signal 121 to control a mode of the buck-boost converter 101. In particular, the BB control logic 120 can send a first control signal 133 (set_buck) to the driver 122 that controls the first high-side switch 104 and the first low-side switch 106 of the buck-boost converter 101. The BB control logic 120 can further send a second control signal 135 (set_boost) to the driver 124 that controls the second high-side switch 110 and the second low-side switch 108 of buck-boost converter 101.

In manufacturing embodiments, a single design solution for the integrated chip that instantiates the USB controller 100 is preferred, as doing so helps to avoid multiple designs, reduces device and customer qualification for multiple printed-circuit boards, and helps to reuse firmware from one board design to another. Hence, efforts are trending towards having the same integrated circuit (IC) design used for wide input and output voltage/current ranges of the USB controller 100 and, consequently, a wide range of inductances for the inductor 102.

While a single design solution may be preferred, a single design solution can result in complex design and for the need to customize multiple boards, after manufacturing the IC USB controller but before shipment to customers, which involves tweaking efforts. These post-manufacturing customizations can involve time-consuming efforts, some of which have to be performed by hand, delays in end-product launches, e.g., due to performing efficiency-enhancing manual tuning of parameters to work across a wide range of input (voltage/current), output (voltage/current), and load requirements. Further, post-manufacturing customizations may also require additional pins or other materials or components to provide the flexible ability to customers to alter IC behavior based on board-design requirements.

The disclosed embodiments can overcome these drawbacks or deficiencies in a single IC design solution for the USB controller 100 by providing programmable control logic within the BB control logic 120 (or other power controller), which can be updated, e.g., via firmware updates. In some embodiments, the USB controller 100 further includes a programmable read-only memory (ROM) 150 or other programmable non-volatile memory device to which to store firmware (FW) for this purpose. The BB control logic 120 (or other firmware-programmed microprocessor, controller, application-specific IC (ASIC), processor, or the like that is to instantiate the control logic) can perform the customizations to the USB controller 100 operation without the need of adding components to fine-tune or tweak bandwidth, frequency response, gain, transconductance, and the like, that may be required for any particular board.

Figure 2:
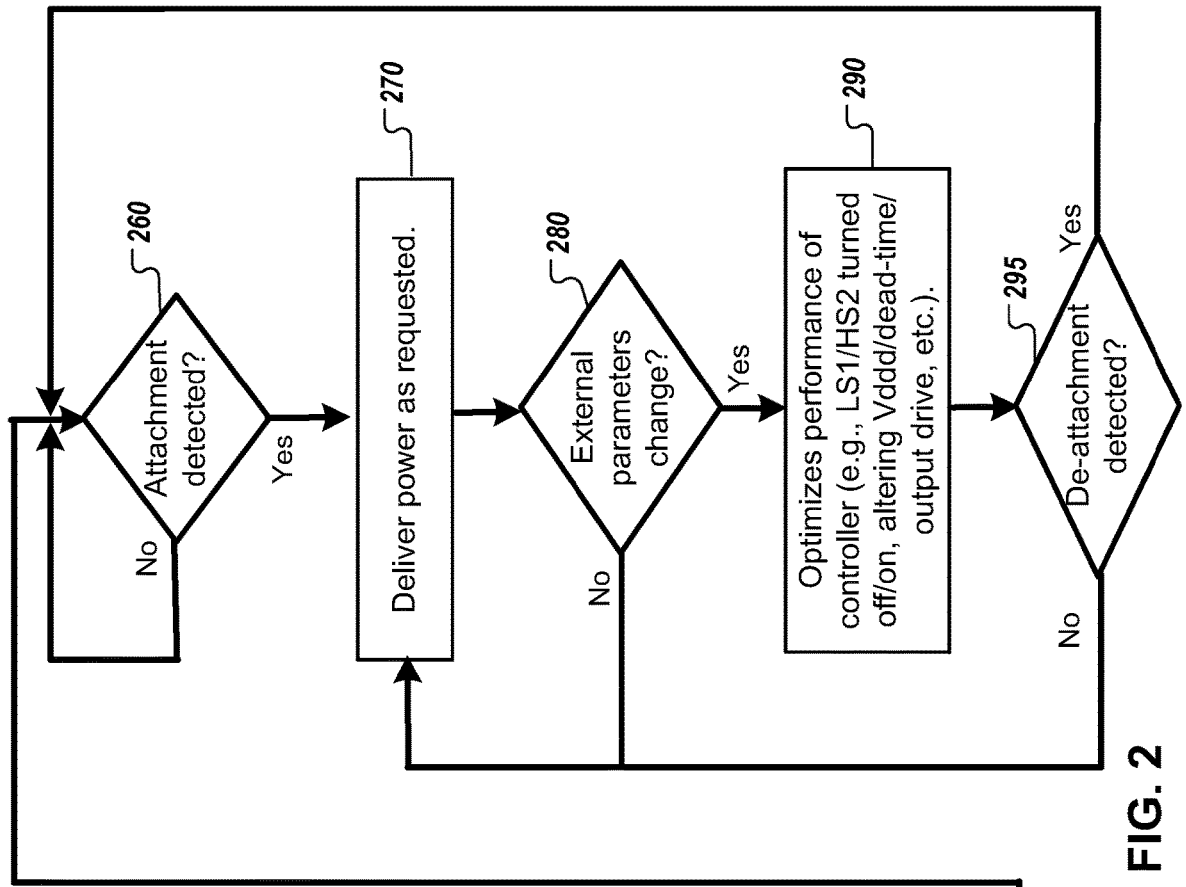
FIG. 2 is a flow diagram of a method of optimizing performance of the buck-boost converter of FIG. 1 according to various embodiments.
Figure 2:
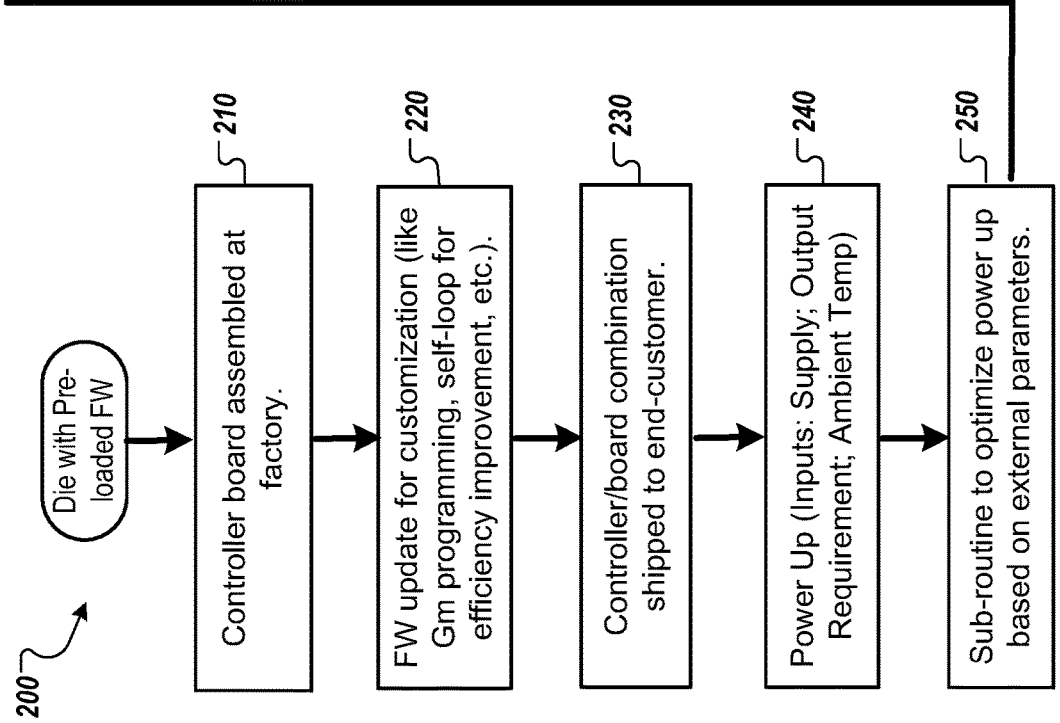

FIG. 2 is a flow diagram of a method 200 of optimizing performance of the buck-boost converter of FIG. 1 according to various embodiments. The method 200 can be performed, in part, by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the BB control logic 120. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In at least some embodiments, the method 200 presupposes that an IC die has been manufactured that includes the USB controller 100. At operation 220, a controller board is assembled at a factory to include the USB controller 100. For purposes of simplicity, the USB controller 100 can be considered the controller board as well, assuming that the USB controller 100 has been operationally mounted to a printed circuit board (PCB) or other circuit board.

At operation 220, a firmware update is performed on the IC die after being located within the controller board in order to carry out customizations, e.g., for Gm programming, self-loop for efficiency improvements, and the like, as will be discussed in more detail. At operation 230, the combination of the USB controller 100 and the controller board is shipped to an end customer.

At operation 240, the processing logic detects a power up of the controller board and the USB controller 100. Upon power-up in the end-customer environment, the processing logic can detect inputs such as the power supply, an output load requirement, an ambient temperature, among others.

At operation 250, the processing logic can perform a sub-routine to optimize power up based on these external parameters. In some embodiments, a firmware update can be performed to the BB control logic 120 so that the sub-routine enables new or updated customized functionality of the USB controller 100 based on the updated BB control logic 120.

At operation 260, the processing logic determines whether attachment of a USB device to the controller board is detected. If detect, at operation 270, the processing logic delivers power as requested by the attached USB device.

While delivering power, at operation 280, the processing logic can further determine whether external parameters such as those discussed with reference to operation 240 and discussed throughout this disclosed have changed. If no parameters have changed, the method 200 can loop back to operation 270 and continue delivering power, as requested.

If, however, one or more external parameters have changed, at operation 290, the processing logic performs one or more operations that optimizes performance of the USB controller 100, e.g., LS1 and HS2 are turned OFF or turned ON, altering Vddd supply voltage, dead-time, drive capability of HS1/LS1/HS2/LS2 driver, or other modifications, which will be discussed in more detail herein below.

At operation 295, the processing logic determines whether the USB device has been de-attached. If no de-attachment has been detected, the method 200 can loop back to operation 270 and continue to deliver power, as requested. If de-attachment has been detected, the method 200 can loop back to operation 260 and monitor for re-attachment of the USB device.

Figures 3, 4:
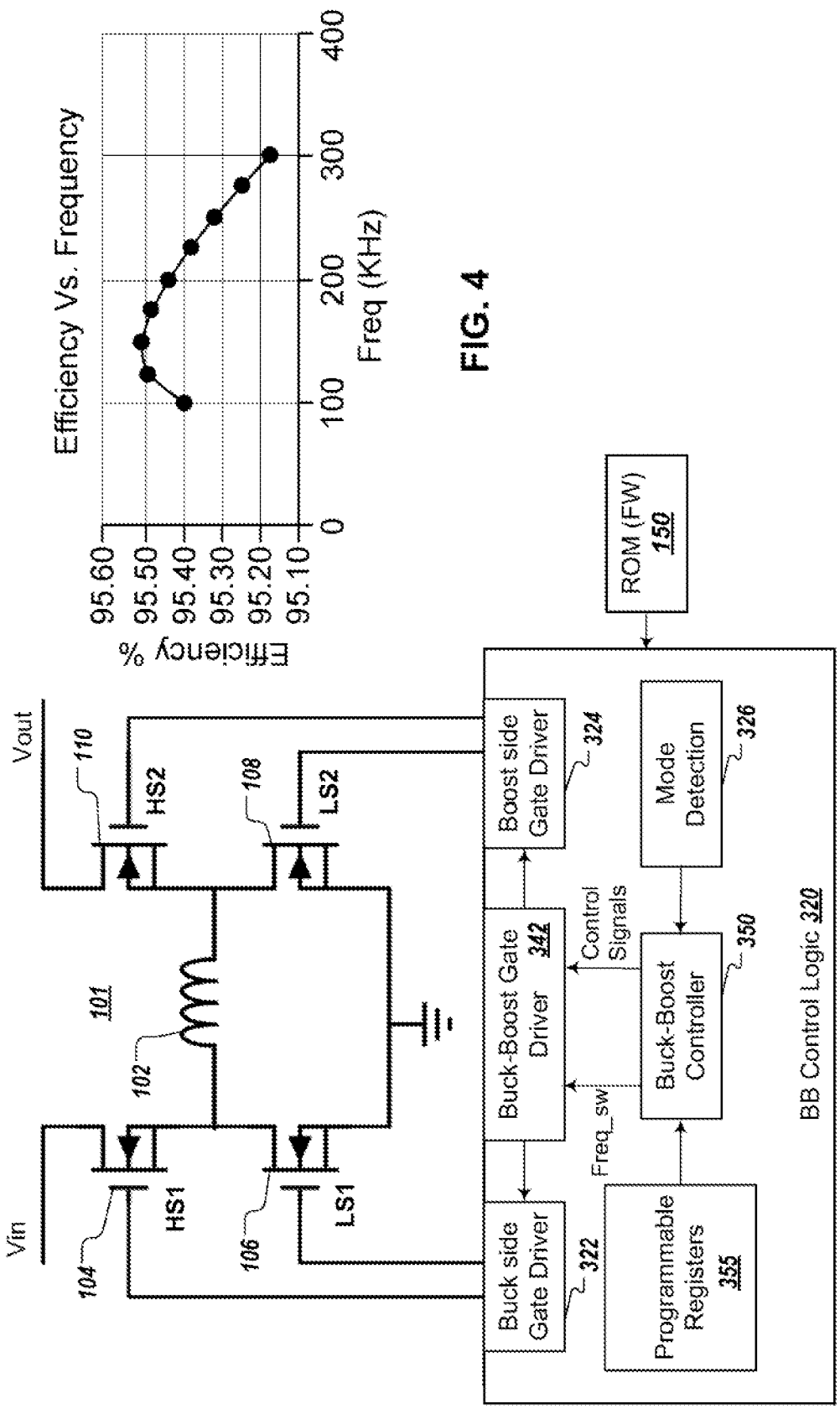
FIG. 3 is a block diagram of a power controller programmed to control the buck-boost converter according to various embodiments.
FIG. 4 is a graph illustrating how efficiency values vary with frequency of operation of the buck-boost converter according to at least an embodiment.

FIG. 3 is a block diagram of buck-boost (BB) control logic 320 programmed to control the buck-boost converter 101, which was discussed with reference to FIG. 1, according to various embodiments. In at least one embodiment, the BB control logic 320 is the BB control logic 120 and the drivers 122 and 124 of FIG. 1. In some embodiments, the BB control logic 320 is a power controller, which can be a firmware-programmed (or firmware-controlled) processor, microprocessor, ASIC, microcontroller, or the like. In at least some embodiments, the BB control logic 320 includes a buck side gate driver 322, a boost side gate driver 324, mode detection logic 326, a buck-boost gate driver 342 coupled between the buck side gate driver 322 and the boost side gate driver 324, a buck-boost controller 350, and programmable registers 355.

In these embodiments, the buck side gate driver 322 can make dynamic changes to the timing of turning on the first high-side switch 104 and the first low-side switch 106, as directed by the BB control logic 320. Similarly, the boost side gate driver 324 can make dynamic changes to the second high-side switch 110 and the second low-side switch 108, as directed by the BB control logic 320. The buck-boost controller 350 can orchestrate or operate as central logic within the BB control logic 320, which can direct the buck-boost gate driver 342 in allocating timing of switching and frequency of operation of the buck-boost converter 101 between the buck side gate driver 322 and the boost side gate driver 324.

In various embodiments, the BB control logic 320 is coupled to other components and voltage or current signals of the USB controller 100, and optionally also to an attached USB device, and thus can gather values of the external parameters that have been discussed and will be discussed in more detail. One of the parameters includes a determination, by the mode detection logic 326, in what mode the buck-boost converter 101 is operating. In some embodiments, the mode detection logic 326 is the same as the mode detect logic 126 of FIG. 1.

In at least some embodiments, the BB control logic 320 includes or has access to the programmable registers 355. In various embodiments, the programmable registers 355 are hardware registers, a volatile memory location (e.g., of local memory such as cache), or a non-volatile memory location (e.g., in on-chip flash memory), or the like. In these embodiments, the programmable registers 355 can be employed to store particular operating parameters, such as transconductance (Gm), frequency, bandwidth, duty cycle, and other such operating parameters, as will be discussed in more detail, which impact the operations of the buck-boost converter within the USB controller 100.

In some embodiments, operations described herein include executing firmware (FW) to program a microprocessor to instantiate the BB control logic 320 and providing at least an input voltage (Vin) and an output voltage (Vout) of the buck-boost converter 101 to the microprocessor. The microprocessor, e.g., operating the mode detection logic 326 can use these Vin and Vout values to determine the mode in which the buck-boost converter 101 is operating.

FIG. 4 is a graph illustrating how efficiency values vary with frequency of operation of the buck-boost converter according to at least an embodiment. Efficiency can be understood as the fraction of input power that reaches an attached load, such as the attached USB device described with reference to FIG. 2. Efficiency, for example, can be calculated as (Vout*Iout)/(Vin*Iin) of the USB controller 100, which is the same outputs and inputs as the buck-boost converter 101. As can be observed, efficiency varies with frequency of operation, but determining the frequency of maximum efficiency may not be straight-forward. In some embodiments, the frequency of the controller board is determined for a maximum efficiency at operation 220 of FIG. 2, e.g., while the controller board is being assembled at a factory.

In at least some embodiments, within a given range of frequency of the buck-boost converter 101, and for required load currents, the BB control logic 320 can sweep a frequency of operation from a minimum frequency to a maximum frequency with a predetermined resolution (e.g., 20 nanoseconds (ns), 40 ns, or the like) every predetermined time period (e.g., 5 seconds (s), 10 s, 20 s, or the like) to find optimum frequency at which efficiency is highest.

In some embodiments, the BB control logic 320 (e.g., control logic) detects the frequency of maximum efficiency. In other embodiments, the BB control logic 320 provides a data output such as may be understood as associated with the data graphed (or plotted) in FIG. 4, from which a designer can determine the frequency of maximum efficiency.

In these embodiments, the BB control logic 320 can store the frequency associated with the maximum frequency in one of the programmable registers 355 that will be referenced (and potentially reprogrammable) after the controller board is put into operation by a customer. More specifically, the BB control logic 320 can later cause the buck-boost converter 101 to operate at a particular frequency consistent with the frequency value stored in the programmable register 355. For example, the buck-boost controller 350 of the BB control logic 320 can cause the buck-boost gate driver 342 to direct the buck side gate driver 322 and/or the boost side gate driver 324 to turn the switches of the buck-boost converter 101 ON and OFF according to a particular frequency. This frequency can be adjusted during soft start at power up, however, as discussed with reference to FIG. 5A. In this way, there is no need to add or change external components (e.g., capacitors, resistors) in order to hard-wire a particular frequency.

In the example of FIG. 4, and only for purposes of explanation, suppose Vin is 18V, Vout is 9V, and Iout is 3 amps (A). Assume also that the operation frequency has to be between 100 KHz and 300 KHz, e.g., to meet electromagnetic interference (EMI) and/or electromagnetic susceptibility (EMS) requirements. In various embodiments, conduction loss occurs higher at lower frequencies whereas switching loss occurs at higher frequencies. In these embodiments, the BB control logic 320 can sweep the frequency of operation from which it can be determined the frequency of maximum efficiency, e.g., approximately 150 KHz in this example. The BB control logic 320 can then be programmed (in one of the programmable registers 355) to lock in this particular frequency for future operation of the USB controller 100.

Figure 5A:
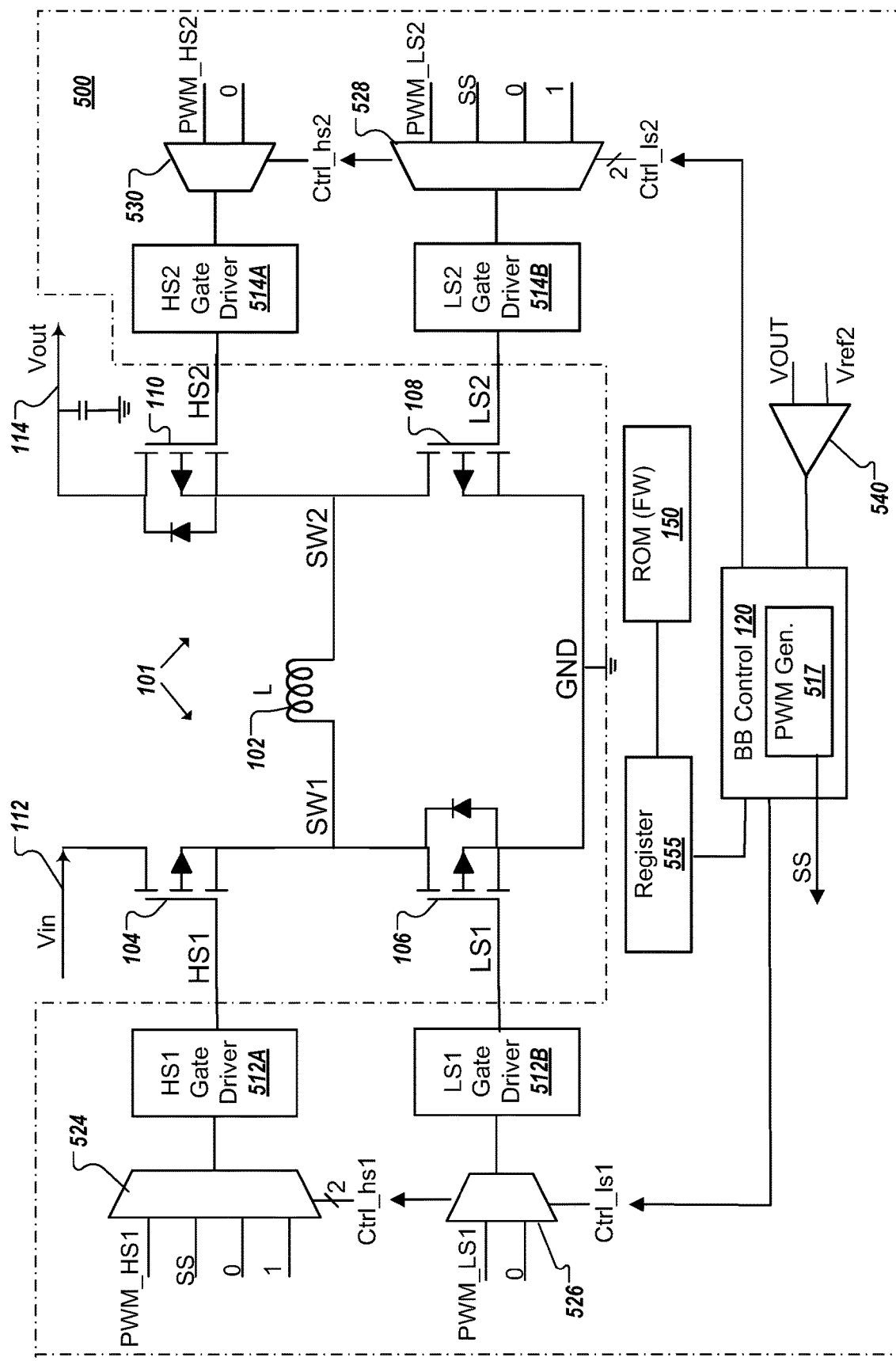
FIG. 5A is a schematic diagram of a USB controller that includes selectable control of the duty cycle of the buck-boost controller in at least some embodiments.

FIG. 5A is a schematic diagram of a USB controller 500 that includes selectable control of the duty cycle of the buck-boost controller 101 in at least some embodiments. This related embodiment illustrates that the gate driver 122 or 322 can actually include a first driver 512A (HS1 gate driver) and a third driver 512B (LS1 gate driver) to drive a gate of the first high-side switch 104 and of the first low-side switch 106, respectively. Further, the gate driver 124 or 324 can actually include a second driver 514A (HS2 gate driver) and a fourth driver 514B (LS2 gate driver) to drive a gate of the second high-side switch 110 and of the second low-side side switch 108, respectively. As will become apparent, the USB controller 500 of FIG. 5A can be understood as an expansion to the USB controller 100 of the embodiment of FIG. 1.

In these embodiments, the USB controller 500 can further include the ROM 150 (FIG. 1), such as an electrically-erasable programmable read-only memory (EEPROM), a register 555, a first multiplexer 524, a second multiplexer 530, a third multiplexer 526, a fourth multiplexer 528, and a soft start (SS) comparator 540 coupled to the BB control logic 120 (FIG. 1). The SS comparator 540, for example, can have an output provided to the BB control logic 120 and inputs including the output voltage (Vout) and a reference voltage (Vref2) set at a threshold value at which the USB controller 500 is to transition control of the buck-boost converter 101 to the EA control loop illustrated and discussed in detail with reference to FIG. 1.

In various embodiments, the BB control logic 120 further includes a pulse-width modulation (PWM) generator 517. In one embodiment, the register 555 is one of the programmable registers 355 (FIG. 3). The ROM 150 can include firmware (FW) that can program the register 555 with particular values (fixed or variable) for the pulse width and frequency at which the BB control logic 120 is to actuate the gate drivers in soft start (SS) mode. By way of example only, the pulse width can range between approximately 20 nanoseconds (ns) to 20 microseconds (µs) and the frequency can range between approximately 10 kilohertz (KHz) and 600 KHz.

In some embodiments, the USB controller 500 can execute the firmware out of the ROM 150 which, in some embodiments, can be adapted to dynamically change or reprogram the register 555 with new values for the pulse width and the frequency. For example, this updating of the pulse width and frequency of the buck-boost converter 101 can be performed at time of power up of the controller board, e.g., at operation 240 of FIG. 2. In these embodiments, the BB control logic 120 determines the duty cycle and frequency to control in-rush current through the buck-boost converter 101 at startup based on various parameters, such as output capacitance (Cout), inductance of the inductor 102, input voltage (Vin), output voltage (Vout), and the load current at power up. In some embodiments, the USB controller 500 is a programmable system-on-a-chip (PSOC) that is already designed to be programmable using firmware and/or other software.

By way of example, and for purposes of explanation only, assume a default setting of 12V for Vin, Vout is 5V, Tout is 0 A, the inductance of the inductor 102 is approximately 5 micro-Henry (µH), and the output capacitance is 250 micro-Farads (µF). In this particular example, the BB control logic 120 can determine that the soft-start frequency should be set to 100 KHz with a 5% duty cycle, which gives startup time of ~10 millisecond (ms). Other examples are, of course, envisioned and the soft-start frequency can be updated during each power up using this approach.

Based on customer requirements, soft-start frequency and duty cycle can be altered in various ways. For example, if the input voltage (Vin) is lower than the threshold Vin (e.g., with which default soft-start settings are defined, for example, 12V or the like), duty cycle can be increased to get the same startup time. Further, if the inductance of the inductor 102 is higher than a threshold inductance (e.g., with which default soft-start settings are defined, for example, 5 µH or the like), the current ramp through inductor 102 would be slower, so duty cycle can be increased to get same startup time. Based on required Vout voltage at startup, the BB control logic 120 can alter the threshold voltage at which control should be given to the EA 118, e.g., for normal operating (not soft-start) mode. Further, if the load current is higher than a particular threshold load current (e.g., with which default soft-start settings are defined, for example, 0 A, 0.5 A, or the like), a final duty cycle can be made to be based on the Vin/Vout (expected Vout) ratio and for this higher load current at startup. Accordingly, the duty cycle can start at 5% and can be incremented every predetermined period of time (e.g., 1 ms, 2 ms, or the like) by a certain percentage amount (e.g., 1%, 2%, 3%, or the like), which can be programmable such that the buck-boost converter 101 can reach a target duty cycle to support the load current during soft start. Further, for a lower output capacitance (Cout) than a particular threshold capacitance (e.g., with which default soft-start settings are defined, for example, 250 µF or the like), and soft-start without load, the duty cycle can be reduced to have lower in-rush currents.

In various embodiments, the BB control logic 120 uses its PWM generator 517 to generate pulses with a pulse width (PW) and at the frequency of the values retrieved from the register 555, where the output of the PWM generator 517 is indicated as "SS" for soft start. In this way, and by also controlling the multiplexers as will be discussed, the BB control logic 120 can bypass the normal EA control loop during soft start by causing the switches of the buck-boost converter 101 to be driven using the SS pulses generated to have the pulse width and frequency that were previously programmed in the register 555.

In some embodiments, the first multiplexer 524 includes an output to turn on the first driver 512A and is to be controlled by the control logic 120, e.g., via a ctrl_hs1 control signal. The first multiplexer 524 has selectable inputs including: a first input from the error amplifier (EA) loop (PWM_HS1); a second input (SS) from the PWM generator 517 of the BB control logic 120; a zero value ("0"); and a one value ("1"). The second multiplexer 530 has an output to turn on the second driver 514A and is to be controlled by the BB control logic 120A, e.g., via a ctrl_hs2 signal. The second multiplexer 530 has selectable inputs including: a first input from the EA loop (PWM_HS2) and a second input having a zero value ("0").

In some embodiments, the third multiplexer 526 has an output to turn on the third driver 512B and is to be controlled by the BB control logic 120, e.g., via a ctrl_ls1 control signal. The third multiplexer 526 has selectable inputs including: a first input from the EA loop (PWM_LS1) and a second input having a zero value ("0"). The fourth multiplexer 528 has an output to turn on the fourth driver 514B and is to be controlled by the BB control logic 120, e.g., a ctrl_ls2 control signal. The fourth multiplexer 528 has selectable inputs including: a first input from the EA loop (PWM-LS2); a second input (SS) from the PWM generator 517 of the BB control logic 120; a zero value ("0"); and a one value ("1"). The inputs from the EA control loop can be, for example, the set_buck 133 and set_boost 135 control signals.

More specifically, in at least one embodiment, the BB control logic 120 detects the mode from the mode signal 121 (FIG. 1), and controls the multiplexers differently depending on whether the USB controller 500 starts up in buck mode or in boost mode. In buck mode, the BB control logic 120 can cause the second high-side switch 110 to operate in diode mode, e.g., by selecting the zero ("0") input value of the second multiplexer 530. Also the BB control logic 120 can cause the first low-side switch 106 to operate in diode mode, e.g., by selecting the zero ("0") input value of the third multiplexer 526. The BB control logic 120 can further retrieve values of the pulse width and the frequency from the register 555 and cause the first high-side switch 104 to turn on using pulses having the pulse width and at the frequency, e.g., by selecting the SS input of the first multiplexer 524. The BB control logic 120 can further detect an output voltage (Vout) at the output terminal of the buck-boost converter that exceeds a threshold value, and, in response to the detection, transfer control of the buck-boost converter to the error amplifier control loop coupled to the control logic 120, as illustrated and discussed with reference to FIG. 1 in detail. The threshold value can come from the reference voltage (Vref2), which can be programmed by the firmware out of the ROM 150 as well.

Further, in boost mode, the control logic 120 can cause the second high-side switch 110 and the first low-side switch 106 to operate in diode mode, e.g., by selecting the zero ("0") input value of each of the second multiplexer 530 and the third multiplexer 526. The BB control logic 120 can further retrieve values of the pulse width and the frequency from the register 555 and cause the first high-side switch 104 and the second low-side switch 108 to turn on using pulses having the pulse width and at the frequency, e.g., by selecting the SS input of the first multiplexer 524 and of the fourth multiplexer 528. Alternatively, in boost mode, the control logic 120 can cause the second high-side switch 110 and the first low-side switch 106 to operate in diode mode, e.g., by selecting the zero ("0") input value of each of the second multiplexer 530 and the third multiplexer 526. The BB control logic 120 can cause the first high-side switch 104 to be always ON e.g., by selecting the one ("1") input of the first multiplexer 524. The BB control logic 120 can further retrieve values of the pulse width and the frequency from the register 555 and cause the second low-side switch 108 to turn on using pulses having the pulse width and at the frequency, e.g., by selecting the SS input of the fourth multiplexer 528. The BB control logic 120 can further detect an output voltage (Vout) at the output terminal of the buck-boost converter 101 that exceeds a threshold value (e.g., of Vref2), and, in response to the detection, transfer control of the buck-boost converter to the error amplifier control loop coupled to the control logic 120, as illustrated and discussed with reference to FIG. 1 in detail.

In some embodiments, the value of Vref2 is programmed (or set) to be slightly higher (e.g., between one and five percent higher) than a target output voltage of the buck-boost converter 101. In this way, the USB controller 500 can avoid rapid (or wide) opening of the first high-side switch 104 and the second low-side switch 108 when the EA control loop takes over. For example, if the target Vout is five volts (5 V), then the firmware can set the Vref2 value to be 5.1 V. This allows the pulse width to be narrower when the buck-boost converter 101 transitions to EA mode and enables a smooth transition into EA control of the buck-boost converter 101. In this way, the output voltage under control of the EA control loop can immediately stabilize without voltage peaks.

Figure 5B:
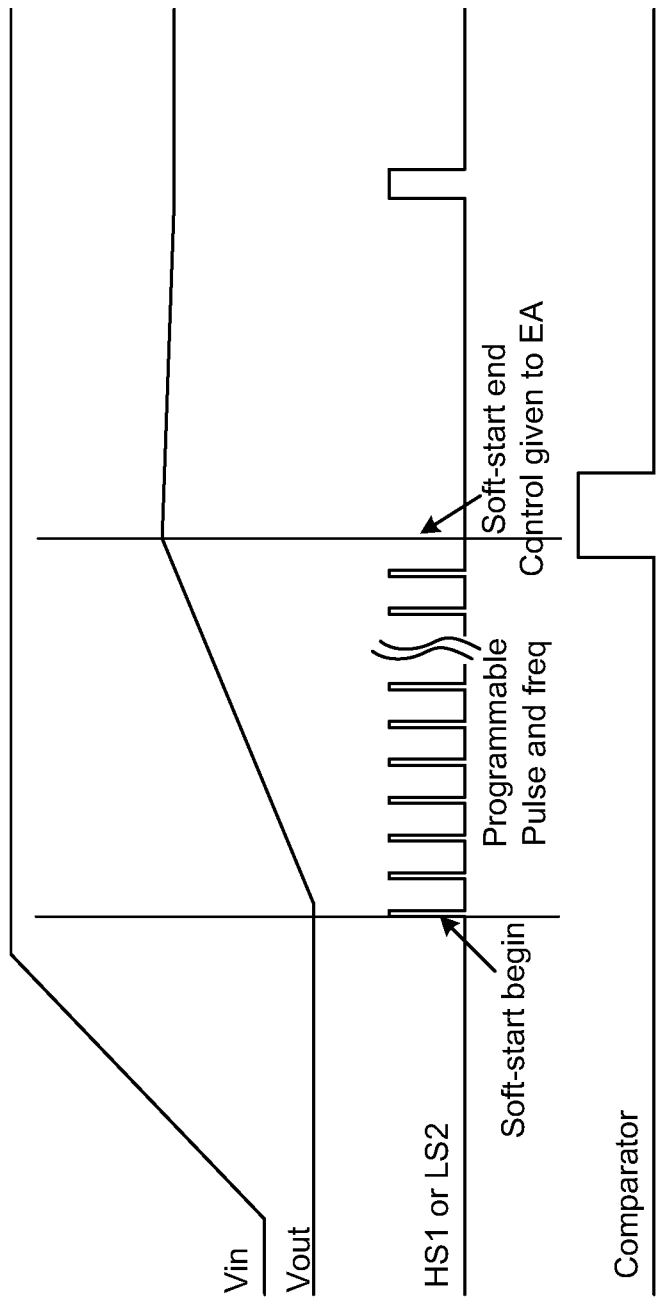
FIG. 5B is a timing diagram of control signals to switches of the buck-boost converter in soft-start mode according to at least one embodiment.

FIG. 5B is a timing diagram of control signals to switches of the buck-boost converter 101 in soft-start mode according to at least one embodiment. For example, a waveform for each of the input voltage (Vin) and the output voltage (Vout) of the USB controller 500 are illustrated, as is a waveform for the first high-side switch 104 or the second low-side switch 108. Further, a waveform for an output of the comparator 540 is illustrated.

As the input voltage ramps, Vin ramps slowly and, at the beginning of the soft start period, the BB control logic 210 sends pulses at the pulse width and frequency retrieved from the register 225 to the first high-side switch 104 for buck mode. In Boost mode, as the input voltage ramps, it does so slowly and, at the beginning of the soft start period, the BB control logic 210 sends pulses at the pulse width and frequency retrieved from the register 225 to the first high-side switch 104 and the second low-side switch 108. During the soft start period, the output voltage (Vout) at the output terminal 114 slowly ramps up to the target voltage, which corresponds with the reference voltage (Vref2). When the comparator 540 is tripped because Vout has reached the threshold value associated with Vref2, the BB control logic 210 can transfer control to the EA control loop, which includes the input CSA 103 along with the slope compensation circuit 107, output CSA 130, the EA 118, the external compensation circuitry 138, and the comparator 116.

Figure 6:
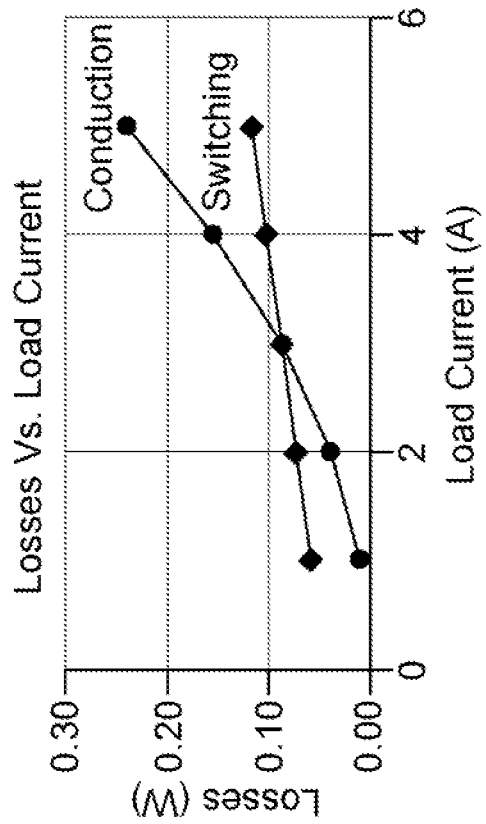
FIG. 6 is a graph of power losses associated with conduction and switching of the buck-book converter according to at least one embodiment.

FIG. 6 is a graph of power losses associated with conduction and switching of the buck-book converter 101 according to at least one embodiment. As is illustrated, as the load current increases past a particular threshold value during normal operation (e.g., not soft start), in this example being approximately 3 A, the conduction losses begin to exceed the switching losses in the buck-boost converter 101. However, while the load current remains low, the switching losses can remain higher than conduction losses.

Accordingly, in at least some embodiments, in order to reduce power loss, and thus improve efficiency, for a high duty cycle (e.g., approximately 85% duty cycle or higher), the BB control logic 120 can disable one of the first low-side switch 104 (LS1) or the second high-side switch 110 (HS2) and keep these FETs in diode emulation mode. Disabling the LS1 or HS2 switch can be performed, for example, if the load current is approximately 1 A or less.

As an example, and for purposes of explanation only, assume that Vin is approximately 18V, Vout is approximately 16V with an approximately 90% duty cycle, with a reduction in load current, e.g., to approximately 1 A or less. In this operation, conduction losses will be lower than switching losses. The BB control logic 320 can detect these parameters, and particularly the high duty cycle and low load current, and in response, turn off one of the first low-side switch 104 (LS1) or the second high-side switch 110 (HS2), and enable these FETs to work in diode mode, which will reduce switching losses and improve efficiency. Similarly, for very low load current (e.g., between 0.1-0.8 A), switching losses can be further reduced by reducing overdrive on HS1/LS2 by reducing the positive supply voltage, Vddd, for the IC instantiation of the USB controller 100. Reducing Vddd will also reduce the positive supply current (IDD) for the IC instantiation of the USB controller 100.

Figure 7:
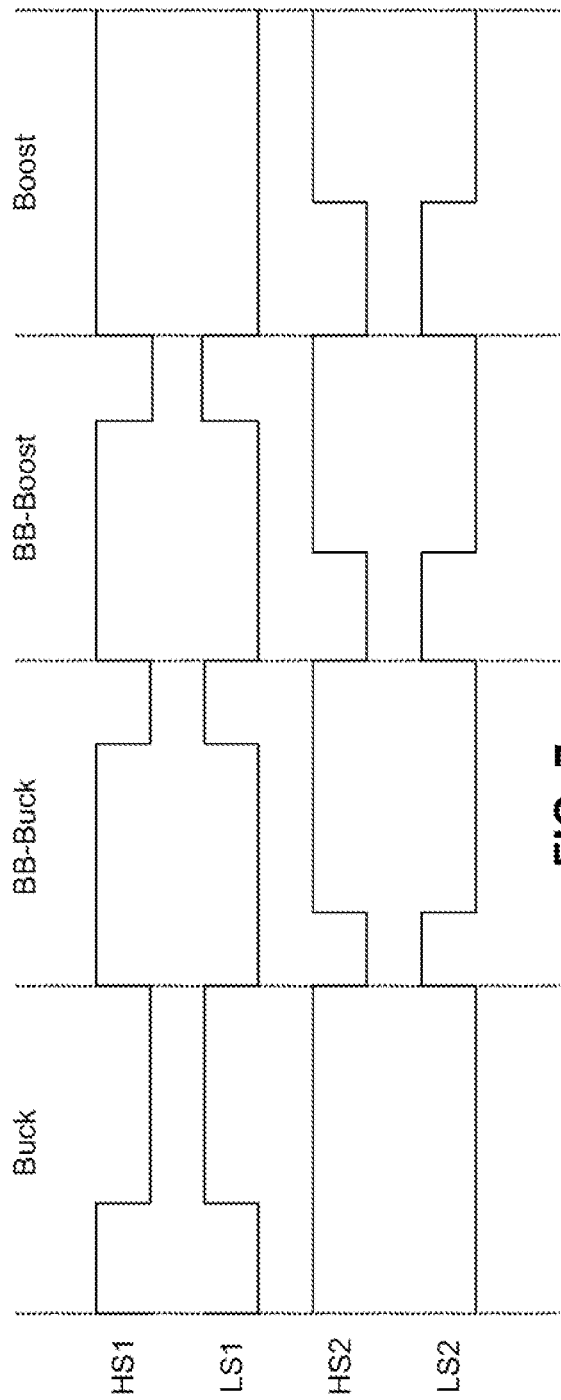
FIG. 7 is a graph illustrating switching of the switches of the buck-boost converter during different modes of operation according to at least one embodiment.

FIG. 7 is a graph illustrating switching of the switches of the buck-boost converter during different modes of operation according to at least one embodiment. It can be observed that in buck mode, switching toggles between the first high-side switch (HS1) and the first low-side switch (LS1). Further, in boost mode, switching toggles between the second high-side switch (HS2) and the second low-side switch (LS2). However, when in BB-buck or BB-boost mode, the switching toggles between both the HS1/LS1 switches and the HS2/LS2 switches. The more toggling that occurs, the more switching, and thus the more generation of electromagnetic interference (EMI).

Accordingly, in at least some embodiments, to reduce EMI during switching, the BB control logic 320 can detect that the buck-boost controller 101 is in either of the BB-buck mode or the BB-boost mode, e.g., using the mode detection logic 326. In response to detecting that the buck-boost converter 101 is operating in one of the BB-buck mode or the BB-boost mode, the control logic 320 can selectively increase gate-driver output resistance of the buck side gate driver 322 (for HS1/LS1) and of the boost side gate driver 324 (for HS2/LS2), e.g., to selectively program slew rates.

In some embodiments, one way of increasing the gate-driver output resistance is to selectively add or remove one or more PFETs or one or more NFETs in the output drivers that drives the gates of the switches of the buck-boost converter 101. The addition or removal of these FETs can be chosen to selectively increase the resistance of the gate drivers 322 and 324 by a determined amount (for example, from 2 ohm to 5 ohm or 10 ohm or 15 ohm, and so on up to 30 ohm) to program the output slew rate of the gate drivers 322 and 324 by a threshold value. This threshold value can be defined based on the HS1/LS1/HS2/LS2 gate capacitances (for example, 0.5V/nano-second). By reducing the slew rates of the gate drivers 322 and 324, the ramping rates are reduced such as to reduce the EMI below a particular threshold EMI, which may be required by one or more USB protocols.

Figure 8:
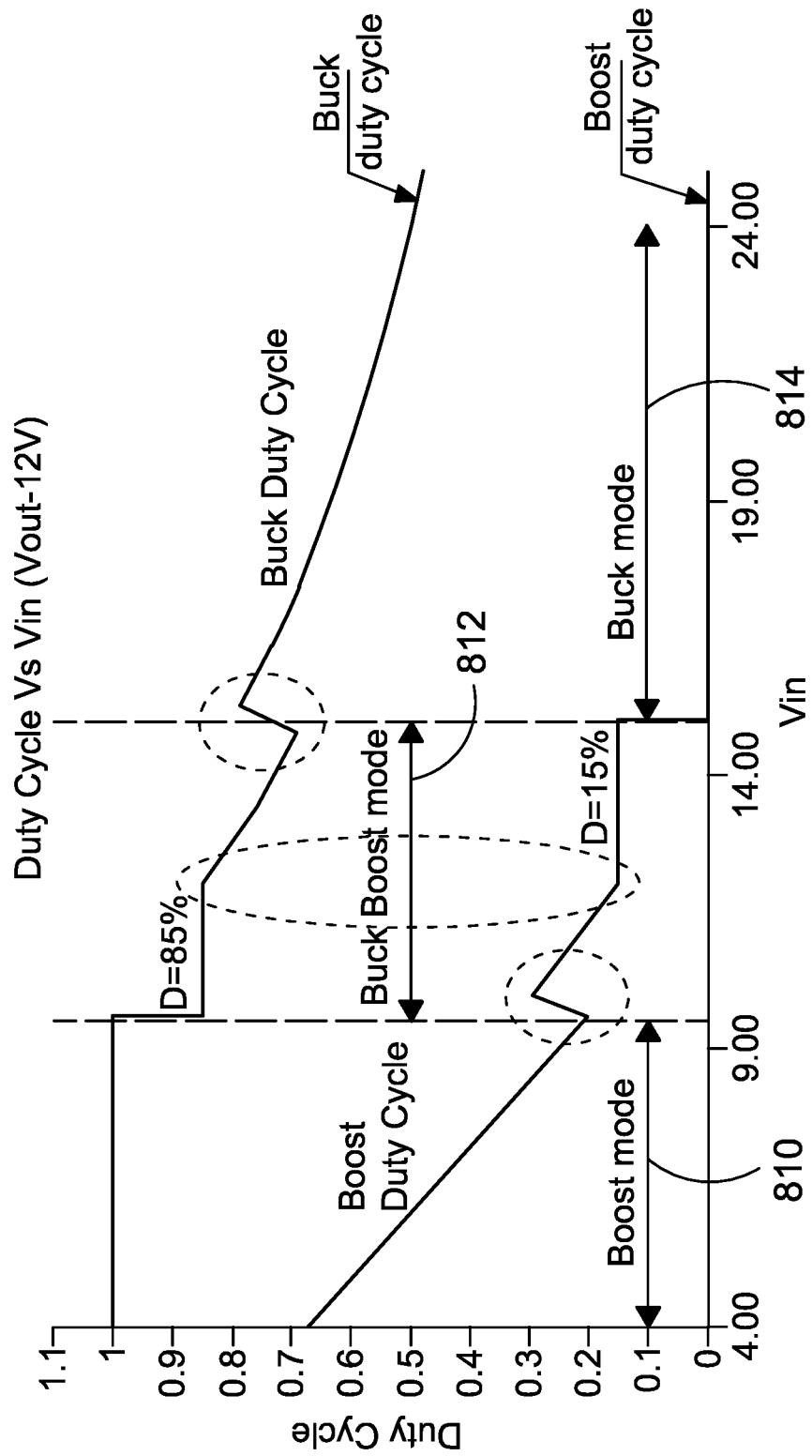
FIG. 8 is a graph of example duty cycle waveforms versus input voltage values of both buck mode and boost mode of the buck-boost converter according to at least one embodiment.

FIG. 8 is a graph of example duty cycle waveforms versus input voltage values of both buck mode and boost mode of the buck-boost converter 101 according to at least one embodiment. As is illustrated, the input supply range can vary widely from between 3.3V to 24V and up to handling of a 5 A load current. One requirement of USB protocols is to meet an output voltage target to within +/−5% despite experiencing line and load transients. Due to fast switching, particularly with high duty cycle of buck mode, meeting this tight tolerance in out voltage (Vout) can prove challenging.

For example, when there is a large change in input supply, the buck-boost converter 101 can move through different modes such as buck, boost, or buck-boost mode. As the input voltage (Vin) increases, the operation of the buck-boost converter 101 can transition from boost mode 810, to buck-boost mode, to buck mode 814, as illustrated. The duty cycle of the buck mode is the upper curve and the duty cycle of the boost mode is the lower curve. The duty cycle can be understood as the time that the first high-side switch 104 (HS1) or the second low-side switch 108 (LS2) of the buck-boost converter 101 are ON (Ton) versus the time the buck-boost converter is switching (Tsw). This duty cycles changes significantly across modes, as illustrated in FIG. 8, and therefore, causes significant noise at the voltage output (Vout) as well. For example, when there is a sudden load change (e.g., of at least 0.15 A/μs), the buck-boost converter 101 is not able to respond quickly due to limited bandwidth, which causes output voltage noise.

The disclosure herein below discusses how to overcome these challenges by, for example, adjusting the transconductance (Gm) of the EA 118 during load and line transients in such a way that the buck-boost converter 101 can meet the output voltage accuracy requirement. The below-described Gm architecture can also enable changing the Gm using the BB control logic 120 or 320 in different modes to optimize transient performance of the buck-boost converter 101.

In at least one embodiment, initial Gm changes can be made while the controller board is assembled at the factory for an end-customer, as discussed with reference to operations 210 and 220 (FIG. 2). For example, Depending on the Vin/Vout, requirements for constant current (CC) and constant voltage (CV) operations, or two switches (buck or boost) versus four switches (BB-buck, BB-boost) modes, the EA loop bandwidth can be altered depending on the BB mode of the buck-boost converter 101 by changing the transconductance (Gm) of the CC/CV error-amplifier. For example, buck mode usually has a higher loop bandwidth than boost mode. Loop bandwidth is the amount of time it takes to correct the output voltage (Vout) within the EA feedback loop in order to correct a change detected at Vout. As discussed with reference to FIG. 1, the first Gm amplifier 118A operates in a constant voltage (CV) mode and the second Gm amplifier 118B operates in a constant current (CC) mode.

In one example, only for purposes of explanation, there exist applications where the buck-boost converter 101 never goes into the boost mode 810, e.g., where Vin is in the range of 9V to 18V and Vout is fixed to, e.g., 5V, 9V, or 11V, or where the buck-boost converter 101 operates only in the buck mode 814. In these situations, system designers can choose to have higher loop-bandwidth as operation mainly involves buck mode. Loop bandwidth can be increased by selectively increasing Gm of the Gm amplifiers, as will be discussed.

In at least one embodiment, an IC controller for a Universal Serial Bus (USB) Type-C device, e.g., the USB controller 100, includes the error amplifier (EA) 118 coupled between an output (Vout) and an input (Vin) of the IC controller. The EA 118 can include an EA output coupled to the pulse width modulation (PWM) comparator 116. The EA 118 can further include the first transconductance amplifier 118A to adjust a current at the EA output, where the first transconductance amplifier 118A operates in a constant voltage mode. The EA 118 can further include the second transconductance amplifier 118B to adjust the current at the EA output, where the second transconductance amplifier 118B operates in a constant current mode.

In these embodiments, the IC controller can further include a first set of programmable registers, e.g., of the programmable registers 355, coupled to the first transconductance amplifier 118A to store a first set of increasingly higher transconductance values, and a second set of programmable registers, e.g., of the programmable registers 355, coupled to the second transconductance amplifier 118B to store a second set of increasingly higher transconductance values. The IC controller can further include control logic operatively coupled to the EA 118, the control logic to: cause the first transconductance amplifier to operate while sequentially using transconductance (Gm) values stored in at least two of the first set of programmable registers; and cause the second transconductance amplifier to operate while sequentially using transconductance (Gm) values stored in at least two of the second set of programmable registers. In some embodiments, this IC controller is adapted to operate only in buck mode.

In at least some embodiments, the control logic can further identify a highest-possible first value, of the first set of increasingly higher transconductance values, and a highest-possible second value, of the second set of increasingly higher transconductance values, at which the output voltage (Vout) at the output is stable while an input voltage (Vin), at the input of the IC controller, ranges over a set of voltages. The control logic can further set the first transconductance amplifier 118A to operate with the highest-possible first value and set the second transconductance amplifier 118B to operate with the highest-possible second value. The output voltage can be considered stable if not drifting beyond a predetermined threshold percentage (e.g., 3%, 4%, 5%, or other percentage set by USB protocol).

In some embodiments, a first step between respective ones of the first set of increasingly higher transconductance values is larger than a second step between respective ones of the second set of increasingly higher transconductance values. Further, the first set of increasingly higher transconductance values can be a wider and a higher (e.g., different) range of values than the second set of increasingly higher transconductance values.

For purposes of explanation only, and by way of example, assume the Gm of the first Gm amplifier 118A can be optionally changed from 0.6 Millisiemens (mS) to 3.0 mS in steps of between 0.5 mS and 0.7 mS (e.g., 0.6 mS), and the Gm of the second Gm amplifier 118B can be optionally changed from 0.1 mS to 1.2 mS in steps of between 0.1 mS and 0.3 mS (e.g., 0.2 mS), although other values are envisioned in different applications and/or controllers. As the BB control logic causes the buck-boost converter 101 to operate at these different Gm values of the EA 118, the BB control logic can detect stable operation and set the Gm of each of the first Gm amplifier 118A and the second Gm amplifier 118B to the Gm values being used when the most stable operation was detected. After the Gm values of the EA 118 are programmed for initial operation, the controller board can be delivered to the end customer. By enabling the BB control logic to perform firmware-based changes to the transconductance values of the EA 118, the output capacitor (Cout) can be reduced, perhaps even to half its usual value, which reduces space and cost of the IC controller. The faster loop bandwidth also helps to reduce VBUS undershoot or overshoot with dynamic load current change.

Figure 9:
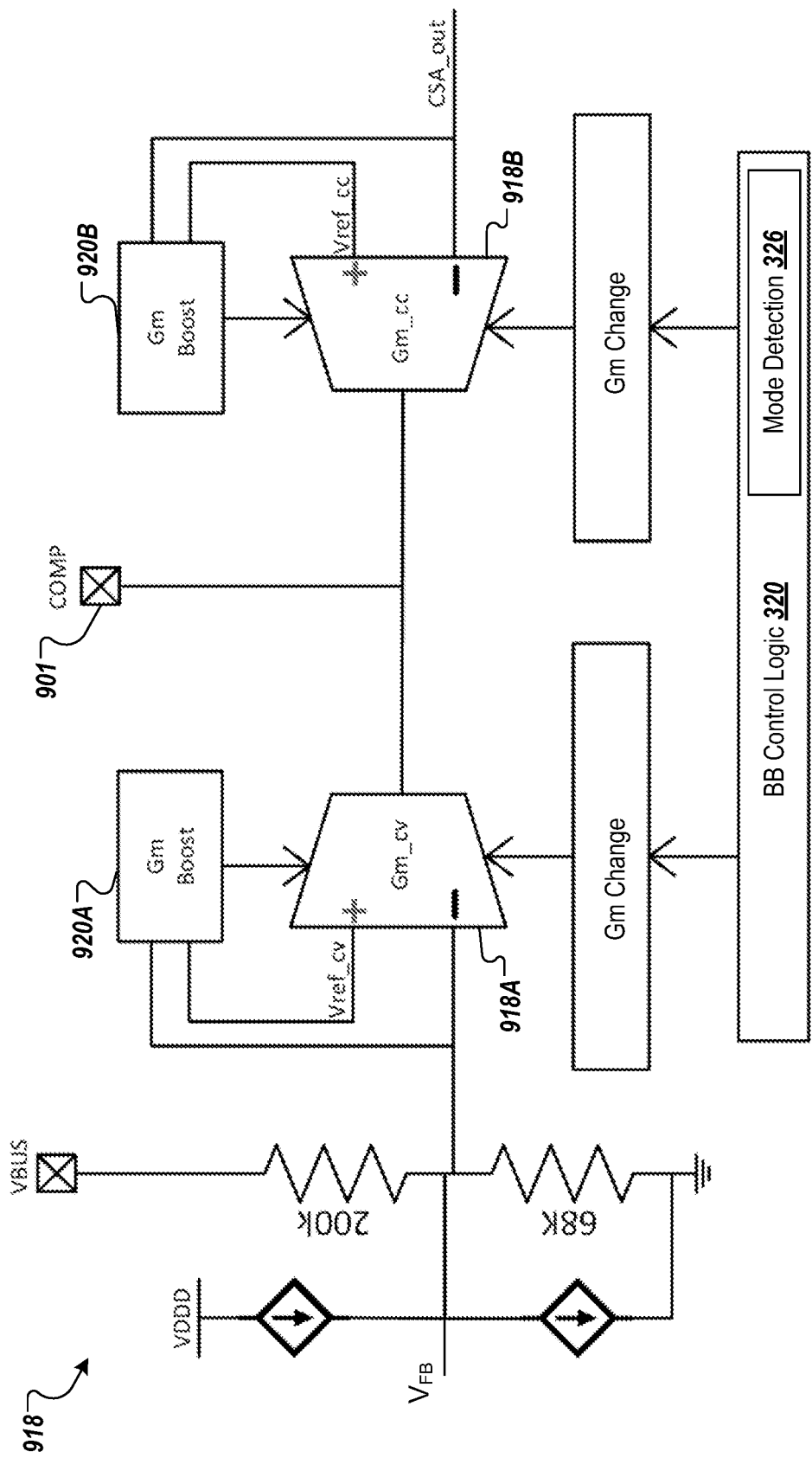
FIG. 9 is a simplified schematic diagram of an error amplifier of the USB controller, which includes a constant voltage (CV) and a constant current (CC) programmable transconductance amplifiers, according to at least one embodiment.

FIG. 9 is a simplified schematic diagram of an error amplifier 918 of the USB controller, which includes a first Gm amplifier 918A that operates under a constant voltage (CV) and a second Gm amplifier 918B that operates under a constant current (CC), each of which has a programmable transconductance (Gm), according to at least one embodiment. In at least some embodiments, the error amplifier 918 is the same as the EA 118 (FIG. 1). For example, in at least some embodiments, the first Gm amplifier 918A is the same as the first Gm amplifier 118A (FIG. 1) and the second Gm amplifier 918B is the same as the second Gm amplifier 118B (FIG. 1). The BB control logic 320 and the mode detection logic 326 were discussed with reference to FIG. 3. The error amplifier 918 can further include a compensation pin 901, which is coupled to the error amplifier output, e.g., to the external compensation circuitry 138 and the EA signal 117 (FIG. 1).

In at least some embodiments, the BB control logic 320 can dynamically adjust the Gm of the first Gm amplifier 918A and/or the second Gm amplifier 918B, during operation, to limit output voltage noise to certain levels during switching, and in particular, in response to transitions between operational modes, e.g., buck, boost, and buck-boost modes, at which points the noise can worsen. In at least one embodiment, the BB control logic 320 detects a mode transition, from the mode detection logic 326, and based on the mode transition or based on the current mode of operation, adjusts the Gm of one or both of the first Gm amplifier 918A and the second Gm amplifier 918B. The particular manner of adjusting the transconductance (Gm) of these Gm amplifiers is disclosed and discussed in detail in a co-pending U.S. patent application Ser. No. 17/381,679, filed Jul. 21, 2021, and entitled "Transconductance Amplifier for Buck-Boost Converter," which is herein incorporated by this reference in its entirety.

Since the buck-boost converter 101 operates in different modes, the USB controller 100, in various embodiments, should stabilize the buck-boost converter across all modes, which is primarily controlled by the loop gain and the unity gain frequency of the buck-boost converter 101. The boost mode typically defines both these parameters for the buck-boost converter 101, as boost mode is more prone to instability. Thus, designers can choose a compensation for the buck-boost converter 101 based on boost mode, which determines the following parameters: constant voltage transconductance (Gm_cv) of the first Gm amplifier 918A; constant current transconductance (Gm_cc) of the second Gm amplifier 918B, and values for the resistor, Rz, and capacitors Cz, and Cp of the external compensation circuitry 138. Even though buck mode and buck boost mode can operate at higher gain and higher unity gain frequency, these parameters limit the max achievable loop gain and unit gain frequency performance in these modes. This restriction on the performance also results in more variation at the output voltage.

To overcome this limitation, the BB control logic 320 adjust the Gm (CV transconductance and CC transconductance) of the buck-boost converter 101 based on the mode in which the buck-boost converter 101 is operating, as the external on-board components (Rz, Cz and Cp) cannot be changed on the fly. The particular operations associated with making these operational updates to the Gm values is discussed in more detail with reference to FIG. 10. The error amplifier 918 can further include a first boost transconductance amplifier 920A coupled to the first transconductance amplifier 918A and a second boost transconductance amplifier 920B coupled to the second transconductance amplifier 918B, which will be discussed in more detail with reference to FIG. 13.

Figure 10:
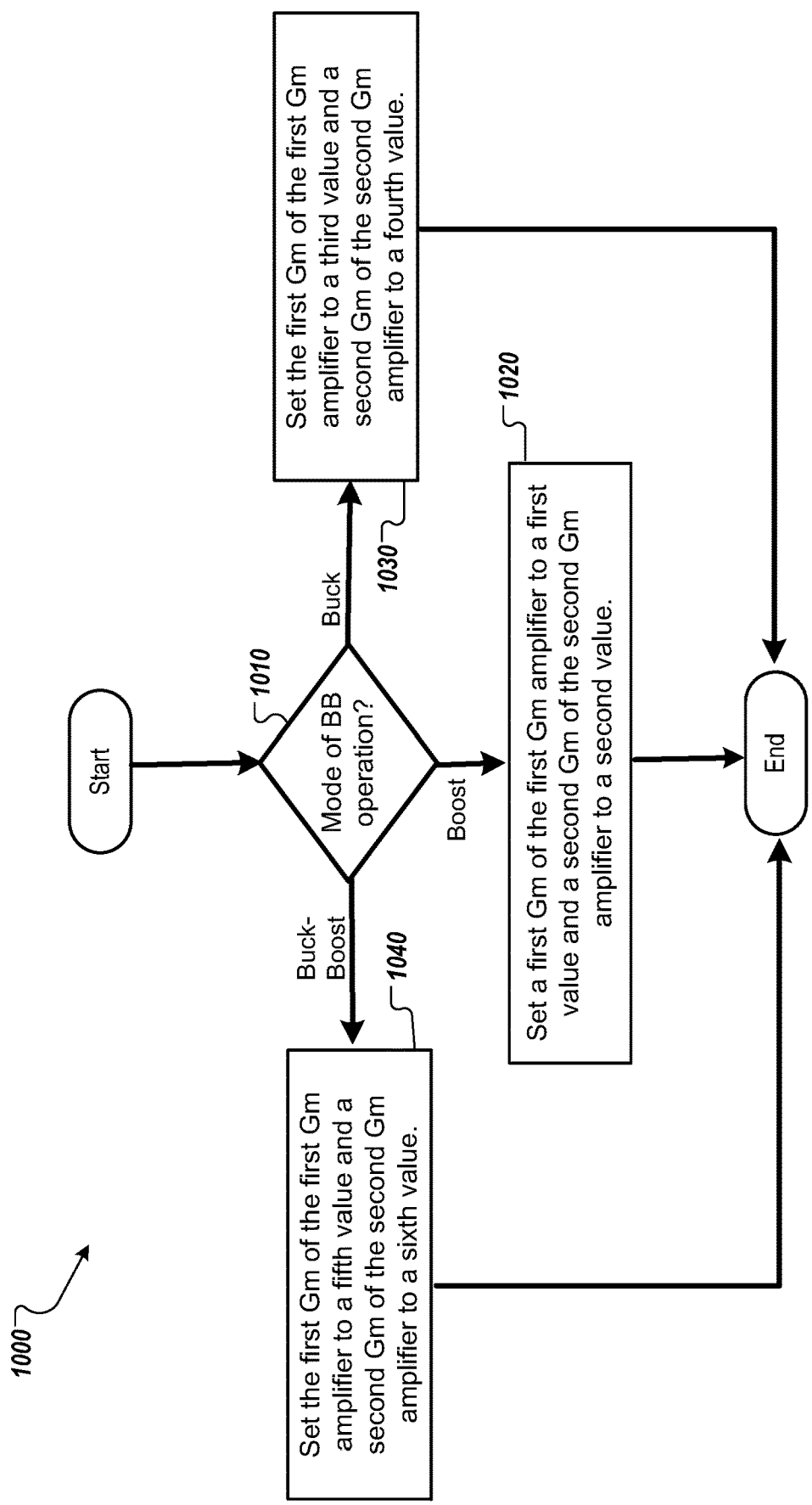
FIG. 10 is a flow diagram of a method for adjusting transconductance of the transconductance amplifiers based on mode of operation of the buck-boost converter according to some embodiments.

FIG. 10 is a flow diagram of a method 1000 for adjusting transconductance of the transconductance amplifiers based on mode of operation of the buck-boost converter according to some embodiments. The method 1000 can be performed by processing logic that can include hardware (e.g., processing device, circuitry, dedicated logic, programmable logic, microcode, hardware of a device, integrated circuit, etc.), firmware (e.g., instructions run or executed on a processing device), or a combination thereof. In some embodiments, the method 1000 is performed by the BB control logic 120 (FIG. 1) or the BB control logic (FIG. 3). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1010, the processing logic determines a mode in which the buck-boost converter 101 is operating. This can include, for example, buck mode, boost mode, or a buck-boost mode, as discussed herein throughout.

At operation 1020, in response to determining that the buck-boost converter is operating in a boost mode, the processing logic sets a first transconductance of the first transconductance amplifier to a first value and a second transconductance of the second transconductance amplifier to a second value, wherein the first value is higher than the second value. Only by way of example, for purposes of explanation, suppose that, in boost mode, the first transconductance (Gm_cv) can be set to between 0.6 mS to 1 mS and the second transconductance (Gm_cc) can be set to between 0.2 mS and 0.4 mS, although other ranges are envisioned. These values are for illustrative purposes. Exact values are determined based on the inductor, gain of current sense amplifier (CSA), external components that are employed.

At operation 1030, in response to determining that the buck-boost converter is operating in a buck mode, the processing logic sets the first transconductance of the first transconductance amplifier to a third value and the second transconductance of the second transconductance amplifier to a fourth value, wherein the third value is higher than the first value, the second value, and the fourth value. Only by way of example, for purposes of explanation, suppose that, in buck mode, the first transconductance (Gm_cv) can be set to between 1.6 mS to 2 mS and the second transconductance (Gm_cc) can be set to between 0.6 mS and 0.8 mS, although other ranges are envisioned.

At operation 1040, in response to determining that the buck-boost converter is operating in a buck-boost mode, the processing logic sets the first transconductance of the first transconductance amplifier to a fifth value and the second transconductance of the second transconductance amplifier to a sixth value, wherein the fifth value is higher than the sixth value. In some embodiments, the fifth value is between the first value and the third value and the sixth value is between the second value and the fourth value. Only by way of example, for purposes of explanation, suppose that, in buck-boost mode, the first transconductance (Gm_cv) can be set to between 1.0 mS to 1.4 mS and the second transconductance (Gm_cc) can be set to between 0.4 mS and 0.6 mS, although other ranges are envisioned.

With increase in Gm, the mid-band gain of the buck-boost converter 101 increases, which increases the bandwidth of the buck-boost converter 101, thereby improving the performance of the buck-boost converter 101. For example, the mid-band gain can be expressed as:

$$\text{Midband gain} = Kf * Gm(cv/cc) * (Rz)$$

Depending on the converter operating within the CV region or CC region, the buck-boost converter 101 can take the Gm of the CV/CC mode. Typically, CC mode bandwidth requirement is lower compared to CV mode. The constant Kf, which represents the percentage change with respect to input error to the error amplifier, can be adjusted to modify the Gm value in some embodiments; however, the value for Rz is constant, as has been discussed.

Figure 11:
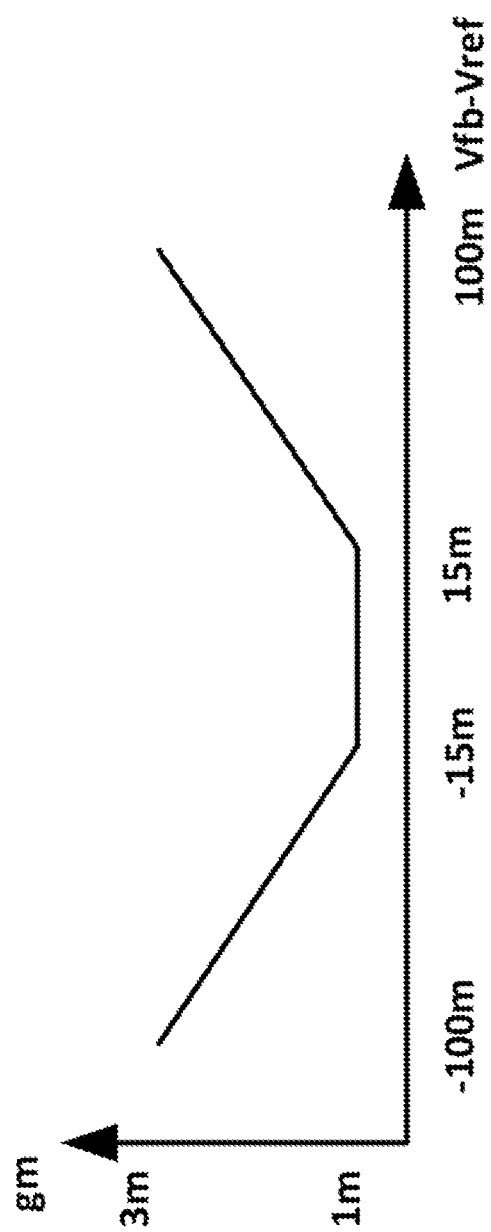
FIG. 11 is a graph of transconductance versus an input error of a transconductance amplifier according to at least one embodiment.

FIG. 11 is a graph of transconductance versus an input error of a transconductance amplifier according to at least one embodiment. With additional reference to FIG. 9, the input error of the first Gm amplifier 918A is the difference between tap point ($V_{FB}$) input and a CV voltage reference (Vref_cv), which is illustrated byway of example in FIG. 11 as causing variation in the Gm of the first Gm amplifier 918A. Further, the input error to the second Gm amplifier 918B is the difference between the output voltage of the output CSA 130 (CSA_out) and a CC voltage reference (Vref_cc). If this voltage difference is greater than a particular threshold difference voltage, then the Gm of the corresponding transconductance amplifier can be increased linearly proportional to the difference in voltage using Gm Boost 920A and/or 920B. In the example of FIG. 11, this threshold difference voltage is set at approximately 15 mV, but other values such as 10 mV, 20 mv, or the like, are also envisioned depending on the design component values.

Figure 12:
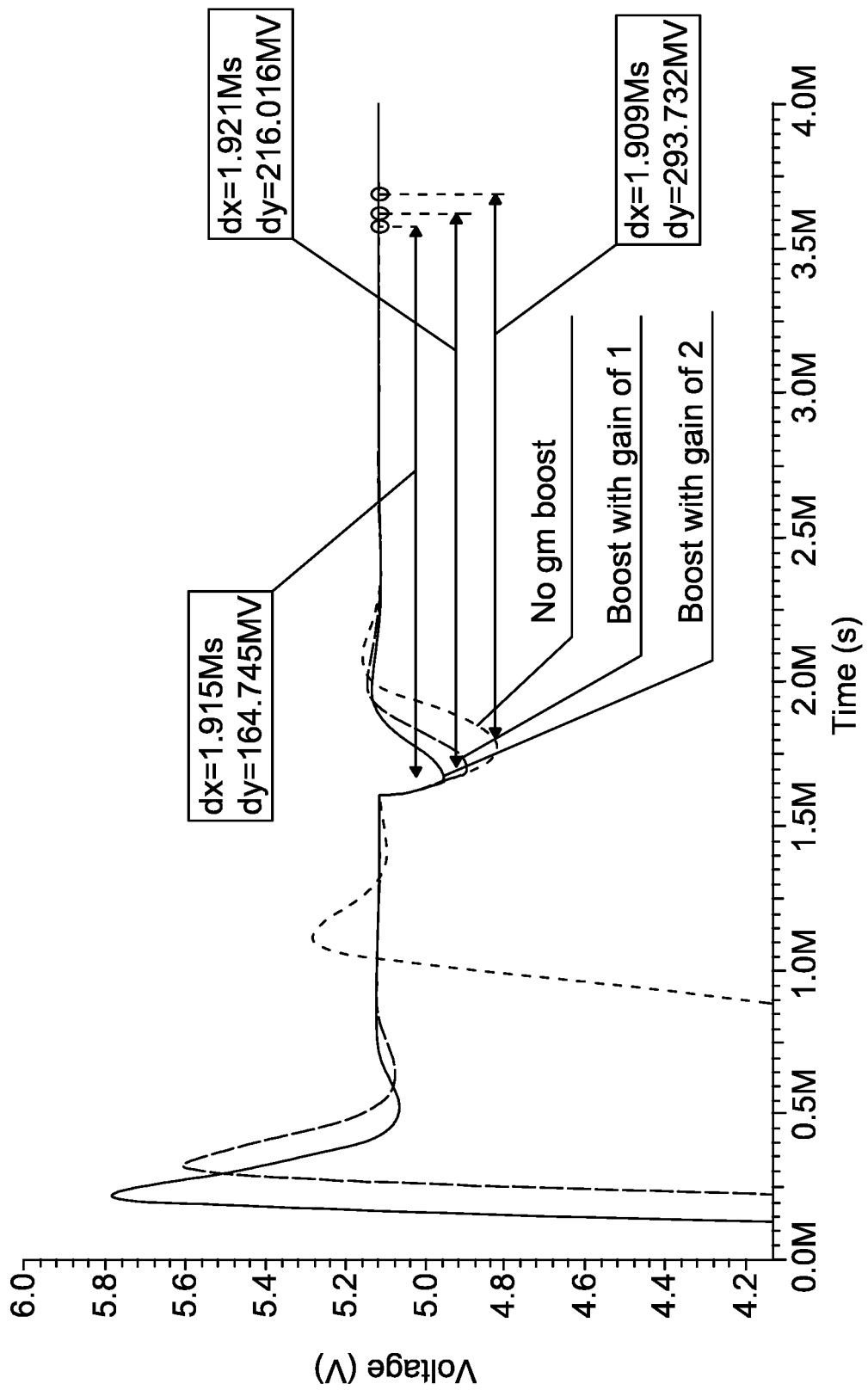
FIG. 12 is a graph of an output voltage of the USB controller when employing three different gain values of the transconductance amplifiers according to an embodiment.

FIG. 12 is a graph of an output voltage of the USB controller when employing three different gain values on the transconductance amplifiers 918A and 918B using Gm boost 920A and 920B respectively, according to an embodiment. As can be observed, with no Gm boost, a larger undershoot occurs; however, when a boost with a gain of one ("1") is used, the undershoot is reduced, and when a boost with a gain of two ("2") is used, the undershoot is reduced even more, improving the controlled response through the EA loop. In the example of FIG. 12, boosting the gain decreases the droop on Vout by approximately half.

When the input voltage (Vin) change of the buck-boost converter causes output voltage undershoot/overshoot more than a threshold amount of voltage, the BB control logic 320 can increase the mid-band gain of the corresponding Gm amplifier. In some embodiments, the threshold amount of voltage is between 50-200 mV, e.g., 100 mV, where the 100 mV threshold amount of undershoot or overshoot corresponds to a change in the input error of the Gm amplifier of 15 mV, for purposes of explanation. As increasing the mid-band gain of the Gm amplifier causes the Gm amplifier to change faster, the duty cycle is proportionally increased to compensate for the undershoot/overshoot.

Further, when a load change causes output voltage undershoot/overshoot more than a threshold amount of voltage, the BB control logic 320 can increase the mid-band gain of the corresponding Gm amplifier. In some embodiments, the threshold amount of voltage is between 50-200 mV, e.g., 100 mV, where the 100 mV threshold amount of undershoot or overshoot corresponds to a change in the input error of the Gm amplifier of 15 mV, for purposes of explanation. As increasing the mid-band gain of the Gm amplifier causes the Gm amplifier to change faster, the duty cycle is proportionally increased to compensate for the undershoot/overshoot.

In at least some embodiments, the BB control logic 320 can further be firmware-programmed to improve the performance of the buck-boost converter 101 by increasing the loop bandwidth through increasing the Gm of the Gm amplifier(s). The Gm of the Gm amplifier is chosen in such a way that loop stability is met under worst condition. In deep boost CC mode (worst condition), the BB control logic 320 can force the bandwidth to be kept at least four ("4") times lower than right half plane (RHP) zero, e.g., significantly lower than the RHP zero value. In these embodiments, the BB control logic 320 determines or retrieves a value for RHP zero, which is proportional with (Vin/Vout)^2 and where RHP to bandwidth (BW) ratio is proportional to Vin/Vout in boost mode. Bandwidth can be increased by increasing gm of the amplifier.

Accordingly, in some embodiments, the BB control logic 320 can further determine that the buck-boost converter 101 is operating in the boost mode, e.g., through the mode detection logic 326. The BB control logic 320 can further one of determine or retrieve a fifth value for right half plane (RHP) zero, and set the second transconductance (of the CC second transconductance amplifier 918B) to be at least four times lower than the fifth value.

Figure 13:
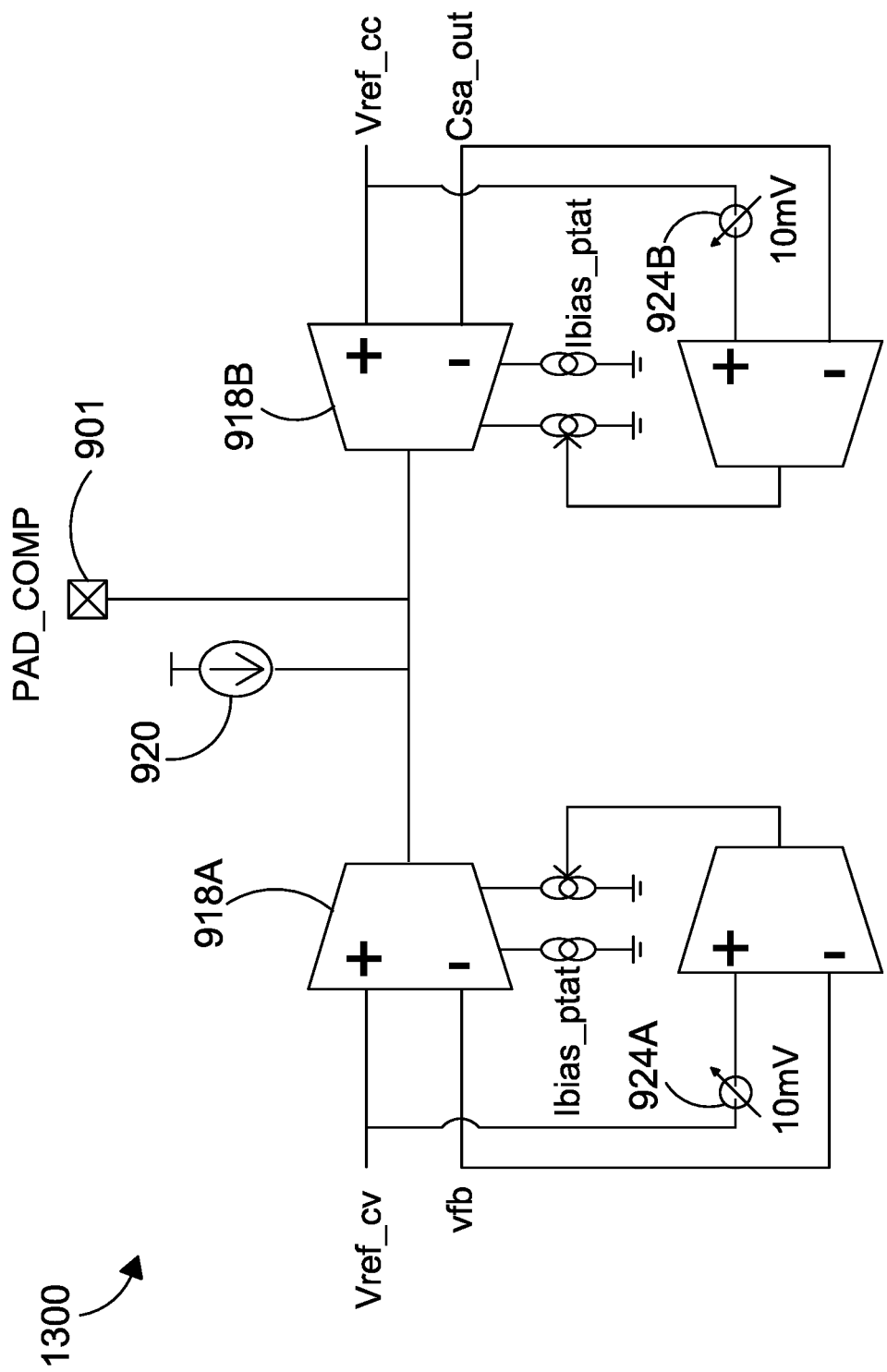
FIG. 13 is a schematic block diagram of transconductance boosting circuitry 1300 according to at least one embodiment.

FIG. 13 is a schematic block diagram of transconductance boosting circuitry 1300 according to at least one embodiment, and which makes additional reference back to the error amplifier 918 of FIG. 9. The error amplifier 918 can further include a current source 920 coupled between a supply voltage (Vddd) and the output pin 901. A transconductance boosting technique can be employed to increase the Gm of error amplifier 918, thereby increasing the system bandwidth when the input error of the error amplifier 918 is large, e.g., within an Imax region of operation. In some USB controllers, boosting starts to happen when the Vbus voltage deviates from a threshold target voltage by 100 mV (or more), for example, or some other programmable threshold target deviation voltage. This helps in improving the transient response of the system.

In at least some embodiments, a first boost transconductance amplifier 920A is to receive, as inputs, the first positive input and the first negative input of the first transconductance amplifier 918A, and to supply an adjustment (e.g., first bias current) in output current to the first transconductance amplifier 918A proportional to a first difference between the first positive input and the first negative input. In these embodiments, a second boost transconductance amplifier 920B is to receive, as inputs, the second positive input and the second negative input of the second transconductance amplifier 918B, and to supply an adjustment (e.g., second bias current) in output current to the second transconductance amplifier 918B proportional to a second difference between the second positive input and the second negative input. In general, the greater the error between inputs of one of the Gm amplifiers, the greater the adjustment by a respective boost transconductance amplifier.

In some embodiments, a threshold minimum voltage source 924A and 924B is supplied to each of the first and second positive inputs of the first boost transconductance amplifier 918A and the second boost transconductance amplifier 918B, respectively, to provide a minimum starting point for current boosting. A value of the threshold minimum voltage source 924A and 924B can be, for example, between 5-20 millivolts (mV). In one embodiment, the value of the threshold minimum voltage source 924A and 924B is 10 mV, as illustrated.

Based on the input error, the Gm of a Gm amplifier can be increased dynamically by increasing the bias current of the Gm amplifier, thereby increasing the Gm, as just explained. Based on the region (CV/CC) and mode in which the buck-boost converter 101 is operating, the Gm change gain can be modified by the BB control logic 320 for better performance, which can be set by firmware depending on mode. The Gm can be increased linearly with error based on a multiplier set, as will be discussed in more detail with reference to FIG. 14. A gain of 1, for example, can mean that Gm doubles for 100 mV of input error, correspondingly the mid-band gain doubles for 100 mV input error. In disclosed embodiments, the point in time from which the Gm boosting starts is also controlled by the BB control logic 320, as firmware directed, depending on the performance requirement(s).

Figure 14:
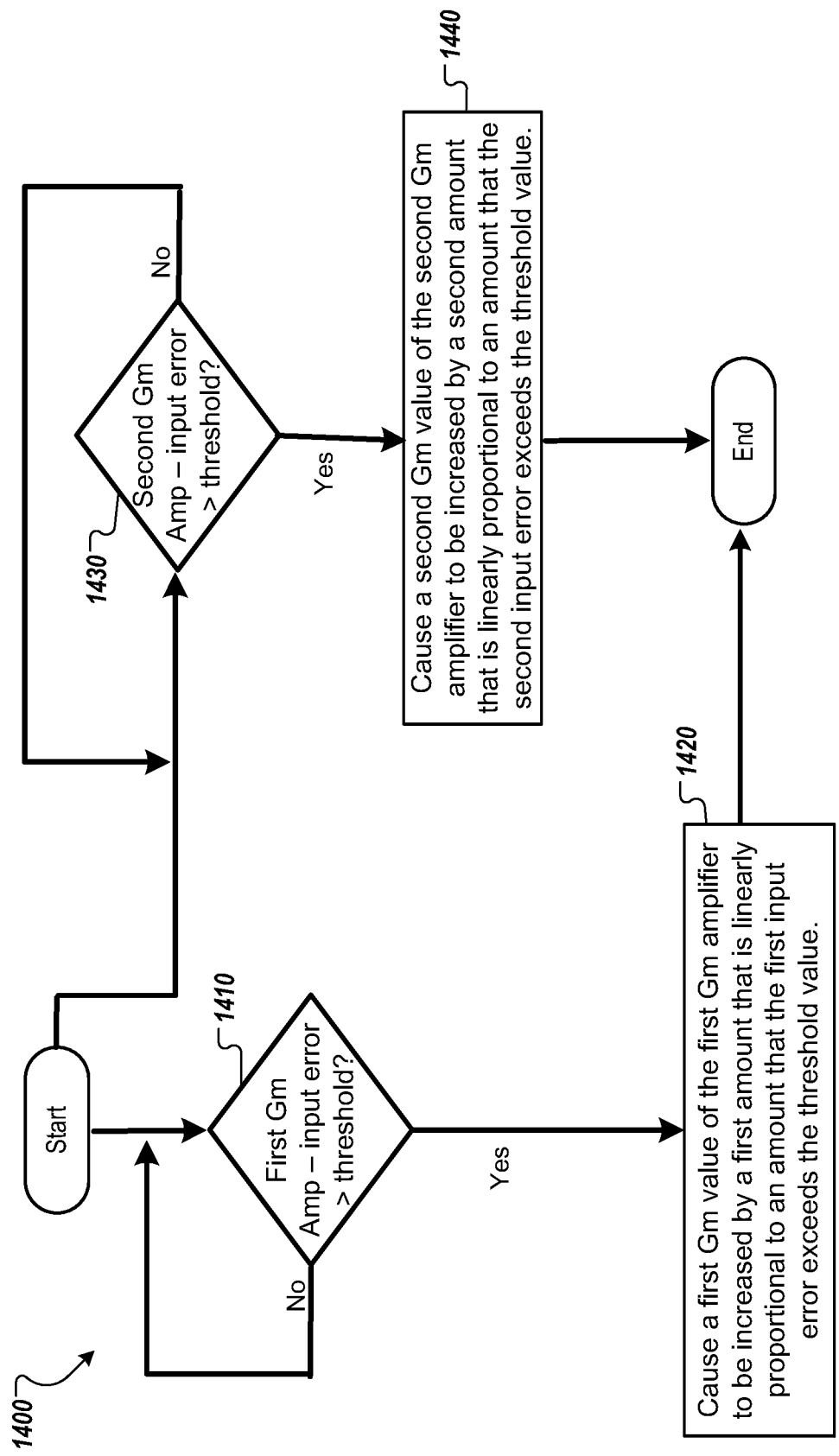
FIG. 14 is a flow diagram of a method for adjusting transconductance of the transconductance amplifiers based on input error according to at least some of the disclosed embodiments.

FIG. 14 is a flow diagram of a method 1400 adjusting transconductance of the transconductance amplifiers based on input error according to at least some of the disclosed embodiments. The method 1400 can be performed by processing logic that can include hardware (e.g., processing device, circuitry, dedicated logic, programmable logic, microcode, hardware of a device, integrated circuit, etc.), firmware (e.g., instructions run or executed on a processing device), or a combination thereof. In some embodiments, the method 1400 is performed by the BB control logic 120 (FIG. 1) or the BB control logic 320 (FIG. 3). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1410, the processing logic determines whether the first transconductance amplifier has a first input error that is greater than a threshold value. The first transconductance amplifier can be the first Gm amplifier 918A, for example.

At operation 1420, in response to determining that the first input error is greater than the threshold value, the processing logic causes a first transconductance value of the first transconductance amplifier to be increased by a first amount that is linearly proportional to an amount that the first input error exceeds the threshold value. In one embodiment, causing the first transconductance value of the first transconductance amplifier to be increased includes causing a first bias current of the first transconductance amplifier to be increased. In at least one embodiment, the threshold value is between 10-20 millivolts, e.g., can be 15 mV.

In some embodiments, the method 1400 further includes determining that the buck-boost converter 101 is operating in a buck mode and causing the first transconductance value of the first transconductance amplifier to be increased includes causing a gain of the first bias current to be approximately tripled or quadrupled. For example, for purposes of explanation only, the gain can be set to 2, where the gain increases by four if quadrupled, and a typical 1 mS Gm can become 4 mS at 100 mV of input error. These values are for illustrative purposes. Exact values are determined based on the inductor, gain of current sense amplifier (CSA), external components that are employed.

In some embodiments, the method 1400 further includes determining that the buck-boost converter 101 is operating in a boost mode and causing a gain of the first bias current to be approximately doubled. For example, for purposes of explanation only, the gain can be set to 1, where the gain increases by twice if doubled, and a typical 1 mS Gm can become 2 mS at 100 mV of input error.

At operation 1430, the processing logic determines whether the second transconductance amplifier has a second input error that is greater than the threshold value. The second transconductance amplifier can be the second Gm amplifier 918B, for example.

At operation 1440, in response to determining that the second input error is greater than the threshold value, the processing logic causes a second transconductance value of the second transconductance amplifier to be increased by a second amount that is linearly proportional to an amount that the second input error exceeds the threshold value. In one embodiment, causing the second transconductance value of the second transconductance amplifier to be increased includes causing a second bias current of the second transconductance amplifier to be increased. In at least one embodiment, the threshold value is between 10-20 millivolts, e.g., can be 15 mV.

In some embodiments, the method 1400 further includes determining that the buck-boost converter 101 is operating in a buck mode and causing the second transconductance value of the second transconductance amplifier to be increased includes causing a gain of the second bias current to be approximately doubled.

In some embodiments, the method 1400 further includes determining that the buck-boost converter 101 is operating in a boost mode and causing the second transconductance value of the second transconductance amplifier to be increased includes causing a gain of the second bias current to be increased by approximately fifty percent.

Various embodiments of the control logic performance optimization for USB-C controllers described herein may include various operations. These operations may be performed and/or controlled by hardware components, digital hardware and/or firmware, and/or combinations thereof. As used herein, the term "coupled to" may mean connected directly to or connected indirectly through one or more intervening components. Any of the signals provided over various on-die buses may be time multiplexed with other signals and provided over one or more common on-die buses. Additionally, the interconnection between circuit components or blocks may be shown as buses or as single signal lines. Each of the buses may alternatively be one or more single signal lines and each of the single signal lines may alternatively be buses.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for USB-C controllers described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An integrated circuit (IC) controller for a Universal Serial Bus (USB) Type-C device, the IC controller comprising:
   an error amplifier (EA) coupled between an output and an input of the IC controller, the EA comprising:
      an EA output coupled to a pulse width modulation (PWM) comparator of a buck-boost converter;
      a first transconductance amplifier to adjust a current at the EA output, wherein the first transconductance amplifier operates in a constant voltage mode; and
      a second transconductance amplifier to adjust the current at the EA output, wherein the second transconductance amplifier operates in a constant current mode;
   a first set of programmable registers coupled to the first transconductance amplifier to store a first set of increasingly higher transconductance values;
   a second set of programmable registers coupled to the second transconductance amplifier to store a second set of increasingly higher transconductance values; and
   control logic operatively coupled to the EA, the control logic to:
      cause the first transconductance amplifier to operate while sequentially using transconductance values stored in at least two of the first set of programmable registers; and
      cause the second transconductance amplifier to operate while sequentially using transconductance values stored in at least two of the second set of programmable registers.

2. The IC controller of claim 1, further comprising the buck-boost converter, wherein the buck-boost converter operates only in buck mode.

3. The IC controller of claim 1, wherein the control logic is further to:
   identify a highest-possible first value, of the first set of increasingly higher transconductance values, and a highest-possible second value, of the second set of increasingly higher transconductance values, at which an output voltage at the output is stable while an input voltage, at the input of the IC controller, ranges over a set of voltages;
   set the first transconductance amplifier to operate with the highest-possible first value; and
   set the second transconductance amplifier to operate with the highest-possible second value.

4. The IC controller of claim 1, wherein a first step between respective ones of the first set of increasingly higher transconductance values is larger than a second step between respective ones of the second set of increasingly higher transconductance values.

5. The IC controller of claim 1, wherein the first set of increasingly higher transconductance values comprises a different range of values than the second set of increasingly higher transconductance values.

6. The IC controller of claim 1, further comprising a memory device to store firmware, the firmware being executable to program the first set of programmable registers, the second set of programmable registers, and the control logic.

7. A method of operating a Universal Serial Bus (USB) Type-C controller, wherein the USB Type-C controller comprises an error amplifier that comprises an output coupled to a pulse width modulation (PWM) comparator of a buck-boost converter, an input coupled to an output of the buck-boost converter, a first transconductance amplifier that operates in a constant voltage mode, and a second transconductance amplifier that operates in a constant current mode, wherein the method of operating the USB Type-C controller comprises:
   determining, by control logic operatively coupled to the error amplifier, a mode in which the buck-boost converter is operating;
   in response to determining that the buck-boost converter is operating in a boost mode, setting, by the control logic, a first transconductance of the first transconductance amplifier to a first value and a second transconductance of the second transconductance amplifier to a second value, wherein the first value is higher than the second value; and in response to determining that the buck-boost converter is operating in a buck mode, setting, by the control logic, the first transconductance of the first transconductance amplifier to a third value and the second transconductance of the second transconductance amplifier to a fourth value, wherein the third value is higher than the first value, the second value, and the fourth value.

8. The method of claim 7, further comprising in response to determining that the buck-boost converter is operating in a buck-boost mode, setting the first transconductance of the first transconductance amplifier to a fifth value and the second transconductance of the second transconductance amplifier to a sixth value, wherein the fifth value is higher than the sixth value.

9. The method of claim 8, wherein the fifth value is between the first value and the third value and the sixth value is between the second value and the fourth value.

10. The method of claim 7, the method further comprising:
   determining that the buck-boost converter is operating in the boost mode;
   one of determining or retrieving a fifth value for right half plane (RHP) zero; and
   setting the second transconductance to be at least four times lower than the fifth value.

11. The method of claim 7, further comprising:
   executing firmware to program a microprocessor of the USB Type-C controller to instantiate the control logic; and
   providing at least an input voltage and an output voltage of the buck-boost converter to the microprocessor with which the control logic can determine the mode in which the buck-boost converter is operating.

12. A method of operating a Universal Serial Bus (USB) Type-C controller, where the USB Type-C controller comprises an error amplifier that comprises an output coupled to a pulse width modulation (PWM) comparator of a buck-boost converter, an input coupled to an output of the buck-boost converter, a first transconductance amplifier that operates in a constant voltage mode, and a second transconductance amplifier that operates in a constant current mode, wherein the method of operating the USB Type-C controller comprises:
   determining, by control logic operatively coupled to the error amplifier, whether the first transconductance amplifier has a first input error that is greater than a threshold value;
   causing, by the control logic, a first transconductance value of the first transconductance amplifier to be increased by a first amount that is linearly proportional to an amount that the first input error exceeds the threshold value in response to determining that the first input error is greater than the threshold value;
   determining, by the control logic, whether the second transconductance amplifier has a second input error that is greater than the threshold value; and
   causing, by the control logic, a second transconductance value of the second transconductance amplifier to be increased by a second amount that is linearly proportional to an amount that the second input error exceeds the threshold value in response to determining that the second input error is greater than the threshold value.

13. The method of claim 12, wherein causing the first transconductance value of the first transconductance amplifier to be increased comprises causing a first bias current of the first transconductance amplifier to be increased.

14. The method of claim 13, further comprising:
   determining that the buck-boost converter is operating in a buck mode; and
   wherein causing the first transconductance value of the first transconductance amplifier to be increased comprises causing a gain of the first bias current to be approximately tripled or quadrupled.

15. The method of claim 13, further comprising:
   determining that the buck-boost converter is operating in a boost mode; and
   causing a gain of the first bias current to be approximately doubled.

16. The method of claim 12, wherein causing the second transconductance value of the second transconductance amplifier to be increased comprises causing a second bias current of the second transconductance amplifier to be increased.

17. The method of claim 16, further comprising:
   determining that the buck-boost converter is operating in a buck mode; and
   wherein causing the second transconductance value of the second transconductance amplifier to be increased comprises causing a gain of the second bias current to be approximately doubled.

18. The method of claim 16, further comprising:
   determining that the buck-boost converter is operating in a boost mode; and
   wherein causing the second transconductance value of the second transconductance amplifier to be increased comprises causing a gain of the second bias current to be increased by approximately fifty percent.

19. The method of claim 12, wherein the threshold value is between 10-20 millivolts.

20. The method of claim 12, the method further comprising:
   determining that the buck-boost converter is operating in a boost mode:
   one of determining or retrieving a value for right half plane (RHP) zero; and
setting the second transconductance value to be at least four times lower than the value for RHP zero.

* * * * *